(12) United States Patent
Mizuno

(10) Patent No.: US 12,513,829 B2
(45) Date of Patent: Dec. 30, 2025

(54) WIRING BOARD, SEMICONDUCTOR DEVICE, AND WIRING BOARD MANUFACTURING METHOD

(71) Applicant: SHINKO ELECTRIC INDUSTRIES CO., LTD., Nagano (JP)

(72) Inventor: Masayuki Mizuno, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 136 days.

(21) Appl. No.: 18/324,632

(22) Filed: May 26, 2023

(65) Prior Publication Data

US 2023/0397342 A1 Dec. 7, 2023

(30) Foreign Application Priority Data

Jun. 3, 2022 (JP) ................. 2022-091130

(51) Int. Cl.
| | | |
|---|---|---|
| *H05K 1/11* | (2006.01) | |
| *H01L 23/498* | (2006.01) | |
| *H05K 3/20* | (2006.01) | |
| *H05K 3/46* | (2006.01) | |

(52) U.S. Cl.
CPC ..... *H05K 3/4644* (2013.01); *H01L 23/49822* (2013.01); *H05K 1/112* (2013.01); *H05K 3/205* (2013.01); *H05K 2201/09563* (2013.01)

(58) Field of Classification Search
CPC ......... H05K 1/112–114; H05K 3/4644; H05K 3/205; H05K 2201/09563; H05K 2201/09718; H05K 1/116; H01L 23/49822; H01L 21/563; H01L 23/16; H01L 23/562; H01L 23/5385; H01L 23/49838; H01L 23/49816

USPC ........................................... 174/255
See application file for complete search history.

(56) References Cited

U.S. PATENT DOCUMENTS

| | | | |
|---|---|---|---|
| 2014/0027165 A1* | 1/2014 | Morita | H05K 3/4673 174/258 |
| 2019/0371717 A1 | 12/2019 | Kita et al. | |
| 2020/0092993 A1 | 3/2020 | Taneda et al. | |

FOREIGN PATENT DOCUMENTS

| | | |
|---|---|---|
| JP | H05-37103 A | 2/1993 |
| JP | H11-67900 A | 3/1999 |
| JP | H11-251753 A | 9/1999 |
| JP | 2000-091743 A | 3/2000 |
| JP | 2011-35120 A | 2/2011 |
| JP | 2019-212692 A | 12/2019 |

(Continued)

OTHER PUBLICATIONS

Japanese Office Action dated Sep. 16, 2025 issued in corresponding Japanese application No. 2022-091130; English machine translation included (8 pages).

*Primary Examiner* — Timothy J Thompson
*Assistant Examiner* — Sidi M Maiga
(74) *Attorney, Agent, or Firm* — Rankin, Hill & Clark LLP

(57) ABSTRACT

A wiring board includes a first wiring layer, an insulating layer that is arranged on the first wiring layer, and a second wiring layer that is arranged on the insulating layer. The first wiring layer includes a first plain layer, an opening that penetrates through the first plain layer, and a reinforcing pad that is arranged in the opening. The second wiring layer includes a second plain layer. The insulating layer includes a reinforcing via that connects the reinforcing pad and the second plain layer.

10 Claims, 25 Drawing Sheets

(56) References Cited

FOREIGN PATENT DOCUMENTS

JP 2020-47735 A 3/2020

* cited by examiner

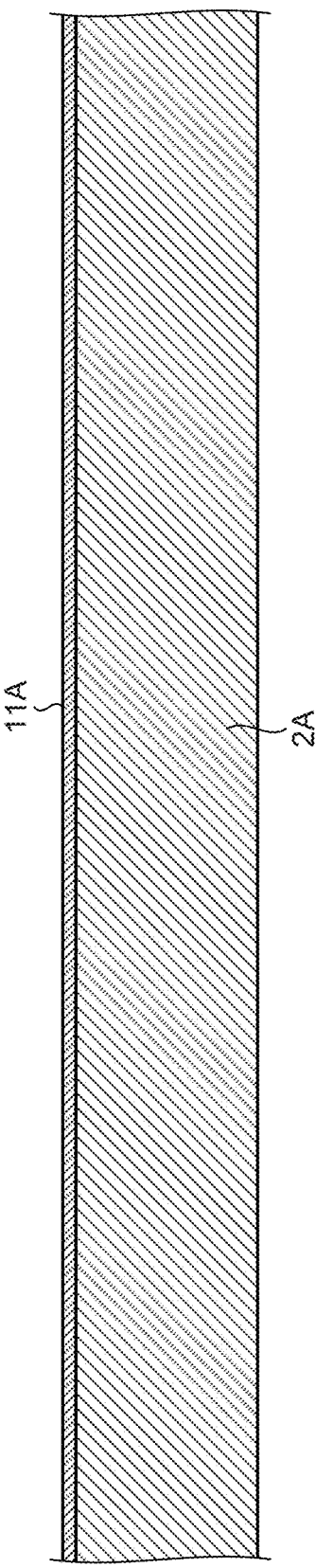

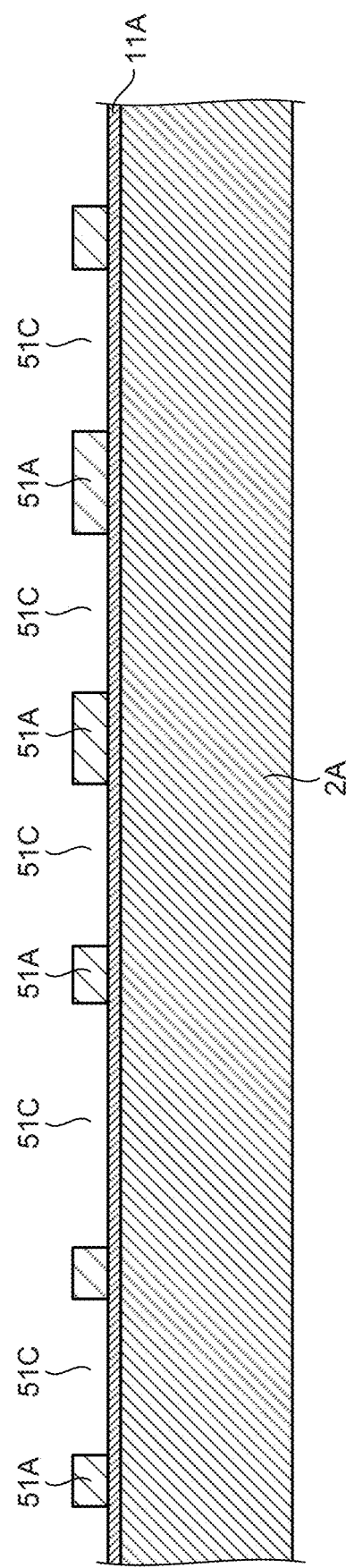

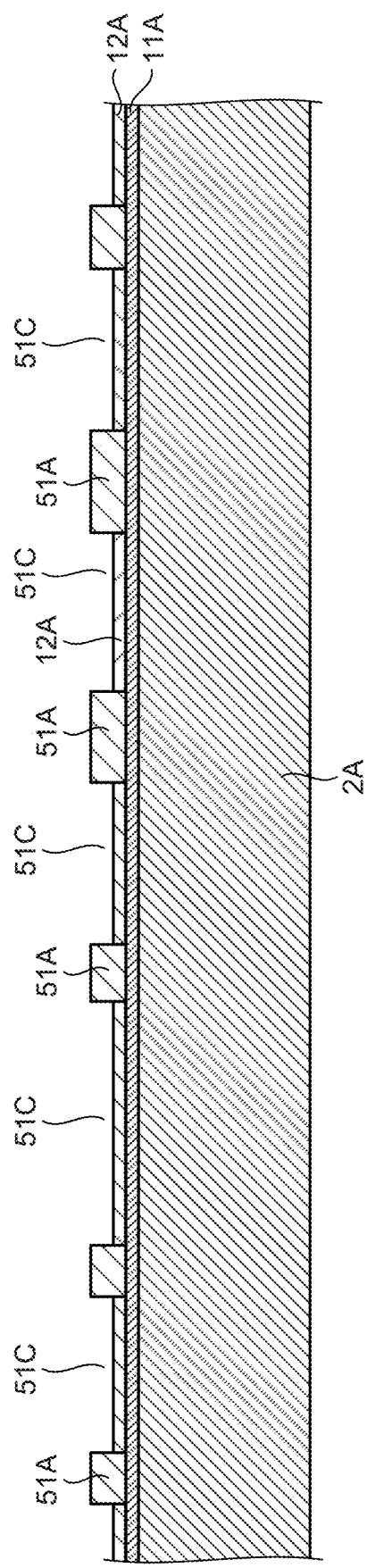

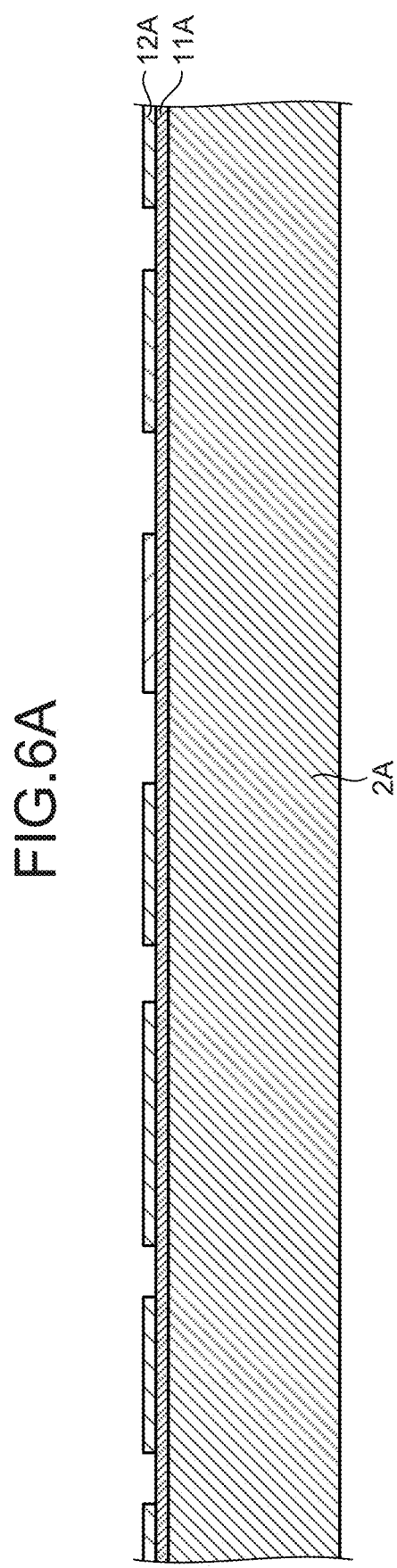

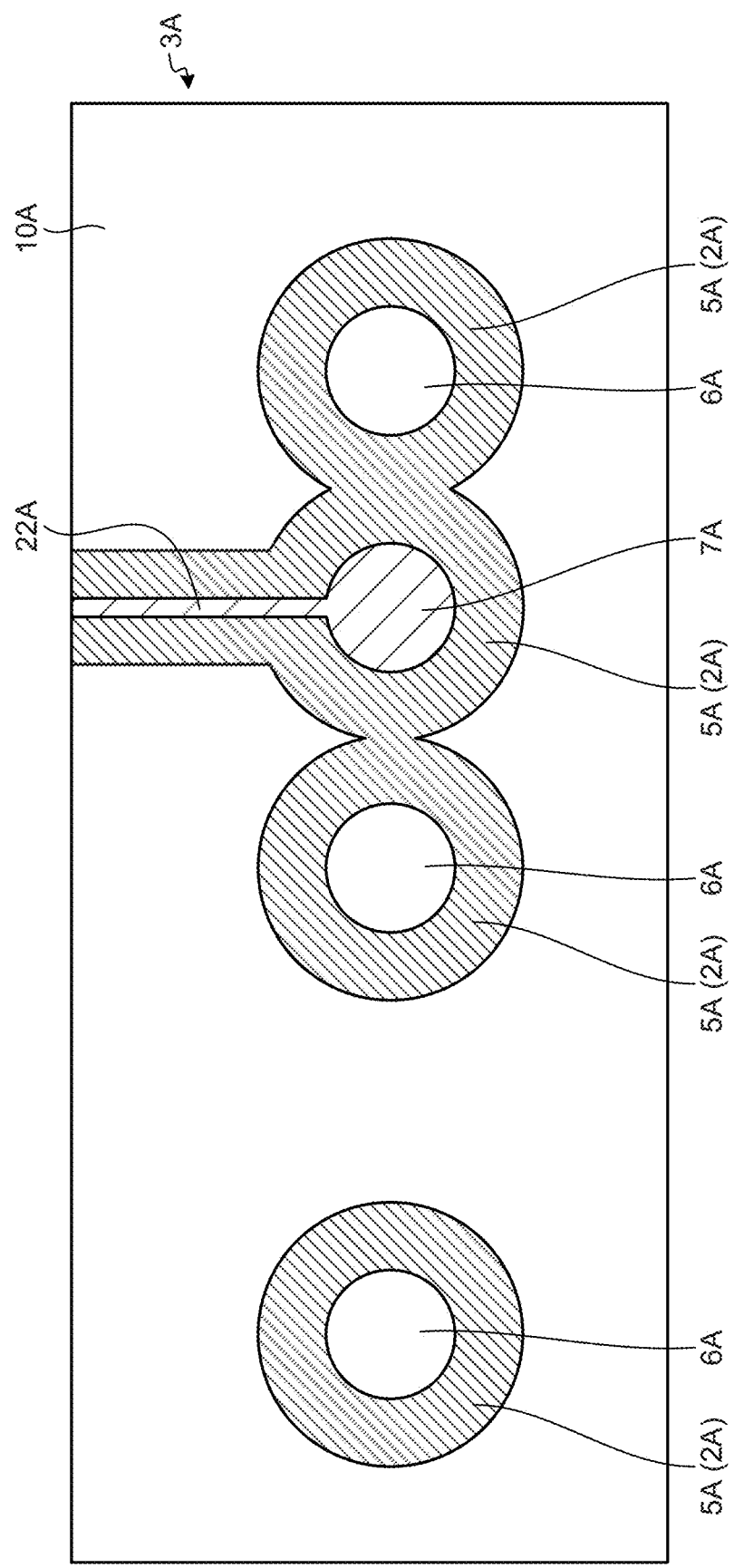

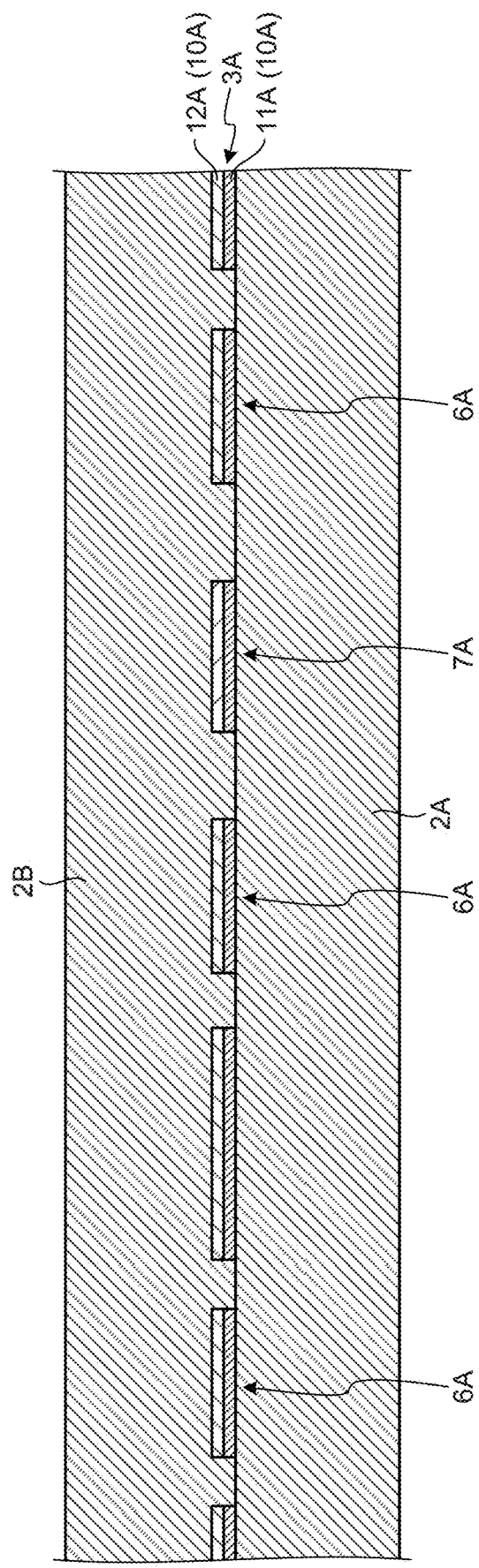

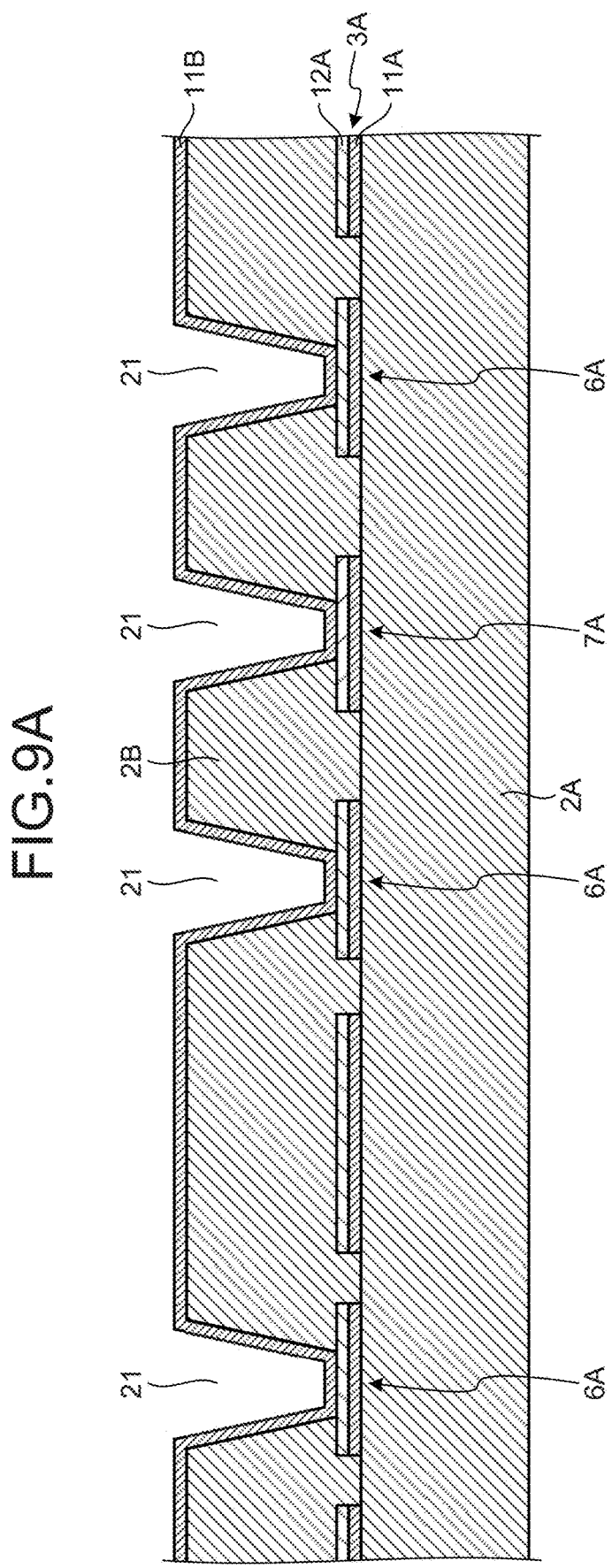

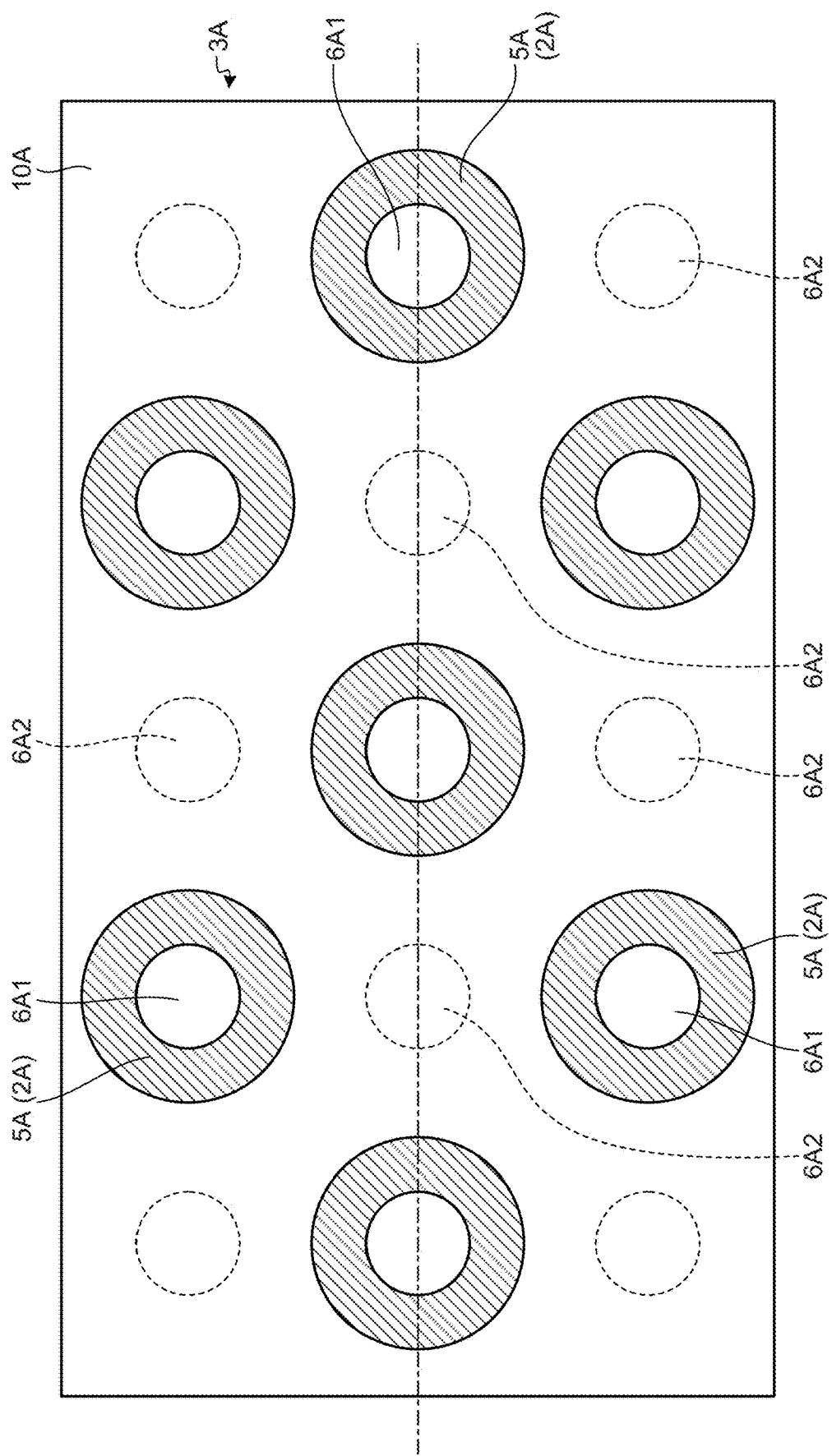

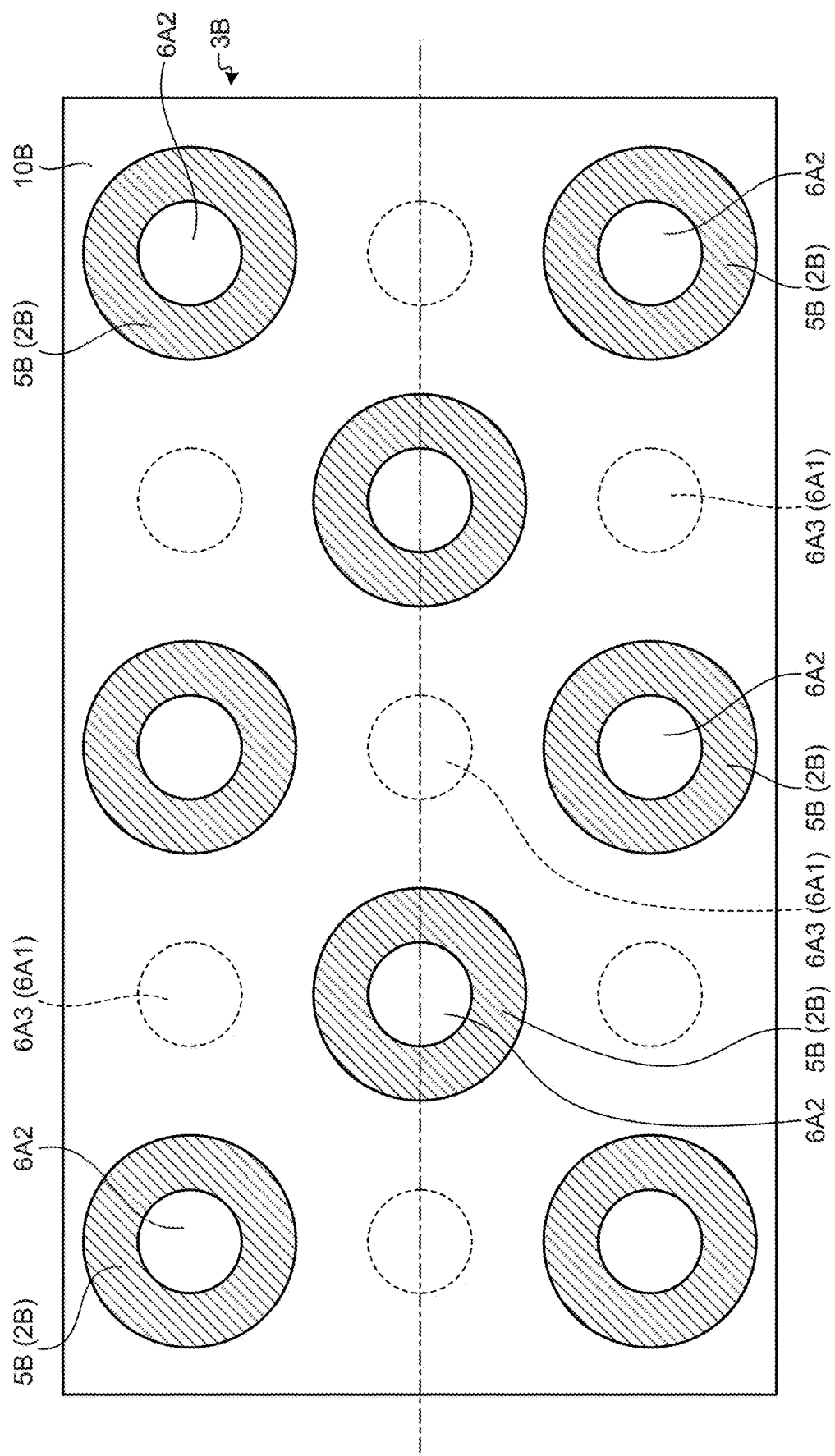

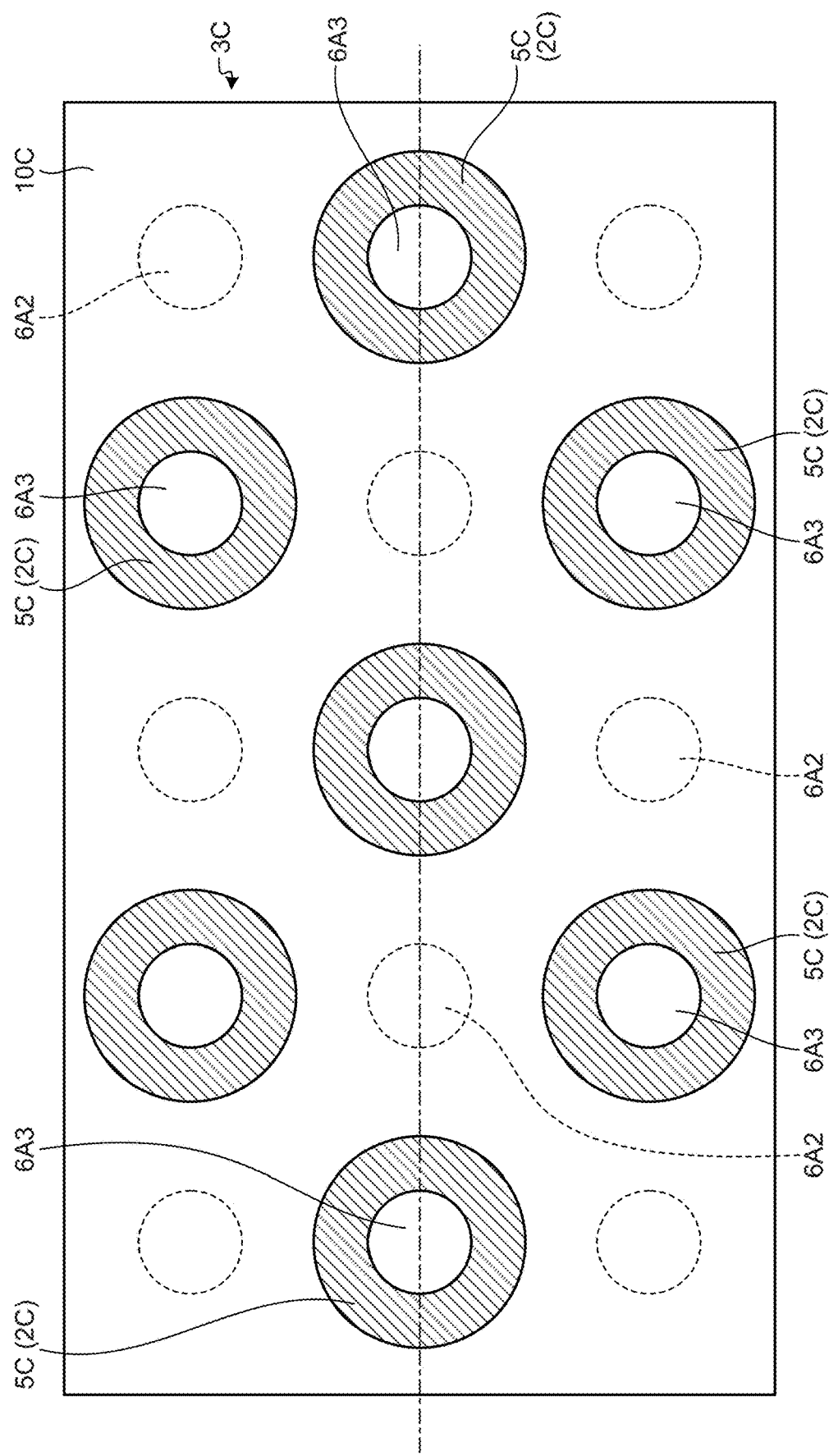

US 12,513,829 B2

WIRING BOARD, SEMICONDUCTOR DEVICE, AND WIRING BOARD MANUFACTURING METHOD

CROSS-REFERENCE TO RELATED APPLICATION

This application is based upon and claims the benefit of priority of the prior Japanese Patent Application No. 2022-091130, filed on Jun. 3, 2022, the entire contents of which are incorporated herein by reference.

FIELD

The embodiments discussed herein are related to a wiring board, a semiconductor device, and a wiring board manufacturing method.

BACKGROUND

FIG. 18 is an explanatory diagram illustrating an example of a conventional wiring board 100. The wiring board 100 illustrated in FIG. 18 includes an insulating layer 101 and a wiring layer 102 that is laminated on the insulating layer 101. On a surface of the insulating layer 101, a concavo-convex portion 101A that includes fine concaves and convexes is arranged by performing a roughening process. On a surface of the wiring layer 102, a concavo-convex portion 102A that includes fine concaves and convexes is arranged by performing a roughening process. When the wiring layer 102 is formed on the insulating layer 101, adhesion between the insulating layer 101 and the wiring layer 102 is increased due to an anchor effect of causing the wiring layer 102 to eat into the concavo-convex portion 101A. Furthermore, when a different insulating layer is further formed on the wiring layer 102, adhesion between the wiring layer 102 and the different insulating layer is increased due to an anchor effect of causing the different insulating layer to eat into the concavo-convex portion 102A.

Patent Literature 1: Japanese Laid-open Patent Publication No. 2000-91743
Patent Literature 2: Japanese Laid-open Patent Publication No. H11-67900
Patent Literature 3: Japanese Laid-open Patent Publication No. H5-37103
Patent Literature 4: Japanese Laid-open Patent Publication No. H 11-251753

In the conventional wiring board 100, adhesion between the wiring layer 102 and the insulating layer 101 is increased by the concavo-convex portion 101A on the surface of the insulating layer 101 and the concavo-convex portion 102A on the surface of the wiring layer 102. However, in the conventional wiring board 100, if an electric signal that flows through the wiring layer 102 is a high-frequency signal, a signal delay increases due to an increase in a signal transmission distance caused by the concavo-convex portion 101A and the concavo-convex portion 102A as compared to a case in which the surface of the wiring layer 102 is flat.

However, if the surface of the insulating layer 101 or the surface of the wiring layer 102 is flat in the wiring board 100, adhesion between the wiring layer 102 and the insulating layer 101 decreases and delamination (separation delamination) occurs between the insulating layer 101 and the wiring layer 102. Meanwhile, delamination prominently occurs between the wiring layer 102, such as a ground plane, and the insulating layer 101.

Therefore, there is a need for a wiring board that is able to prevent delamination between the wiring layer 102 and the insulating layer 101 without providing the concavo-convex portion 101A on the surface of the insulating layer 101 and the concavo-convex portion 102A on the surface of the wiring layer 102.

SUMMARY

According to an aspect of an embodiment, a wiring board includes a first wiring layer, an insulating layer that is arranged on the first wiring layer, and a second wiring layer that is arranged on the insulating layer. The first wiring layer includes a first plain layer, an opening that penetrates through the first plain layer, and a reinforcing pad that is arranged inside the opening. The second wiring layer includes a second plain layer. The insulating layer includes a reinforcing via that connects the reinforcing pad and the second plain layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 4B is an explanatory diagram illustrating an example of a first seed layer formation process;
FIG. 5A is an explanatory diagram illustrating an example of a first plated resist layer formation process;
FIG. 5B is an explanatory diagram illustrating an example of a first electroplated layer formation process;
FIG. 6A is an explanatory diagram illustrating an example of a first plated resist layer removal process;
FIG. 7 is a plan view of a first wiring layer of the wiring board;
FIG. 8A is an explanatory diagram illustrating an example of a second insulating layer formation process;
FIG. 9A is an explanatory diagram illustrating an example of a second seed layer formation process.

FIG. 15A is a schematic plan view illustrating an example of a first wiring layer;

FIG. 15B is a schematic plan view illustrating an example of a second wiring layer;

FIG. 15C is a schematic plan view illustrating an example of a third wiring layer;

DESCRIPTION OF EMBODIMENTS

Embodiments of a wiring board, a semiconductor device, and a wiring board manufacturing method disclosed in the present allocation will be described in detail below with reference to the drawings. Meanwhile, the present invention is not limited by the embodiments below.

First Embodiment

Figure 1:
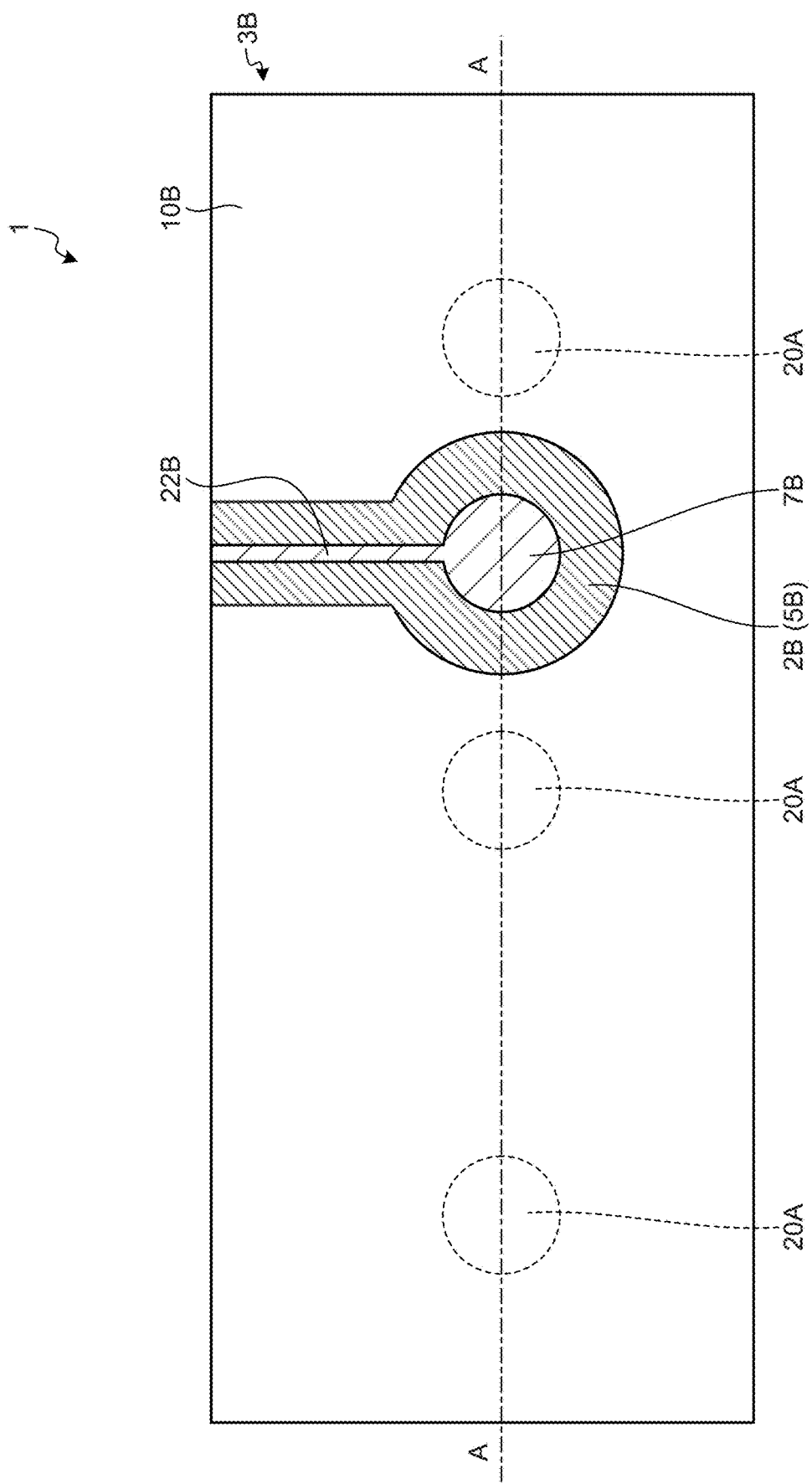
FIG. 1 is a plan view of a second wiring layer of a wiring board of a first embodiment.
Figure 2:
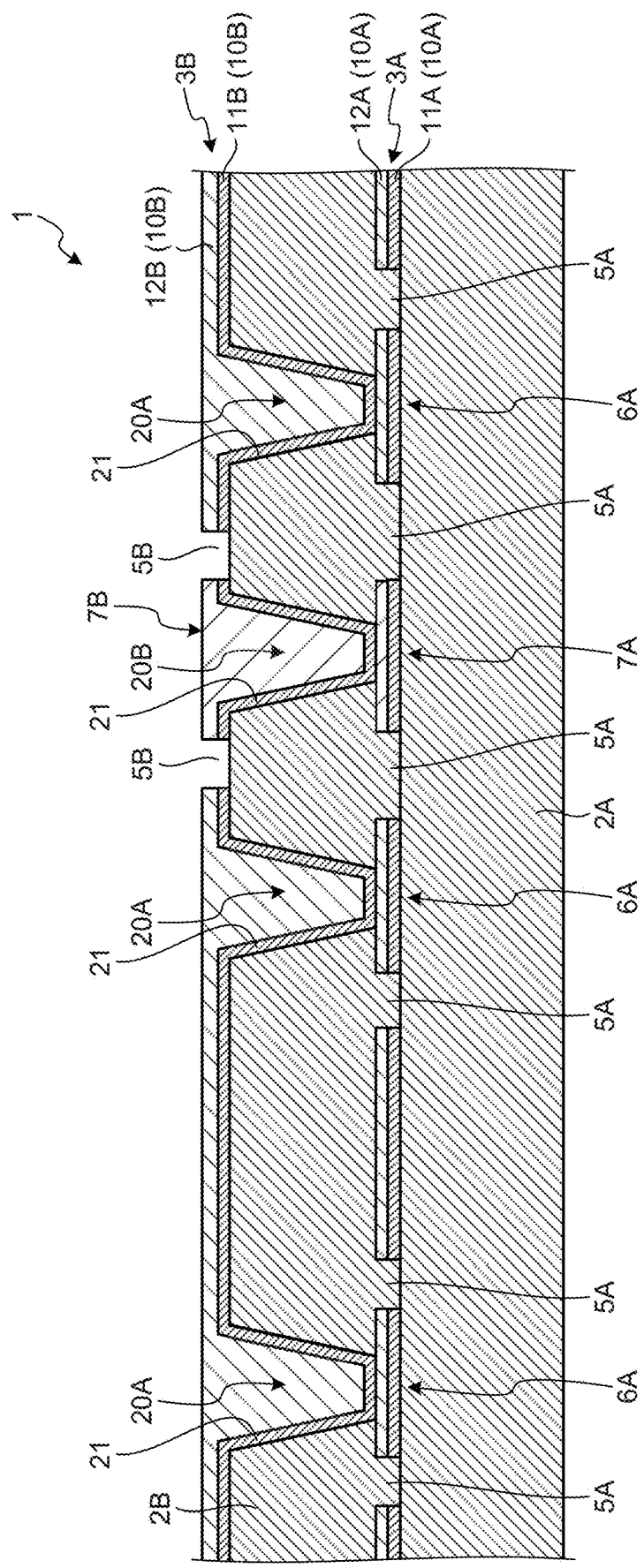
FIG. 2 is a schematic cross-sectional view taken along a line A-A in FIG. 1.

FIGS. 1, 2, and 7 illustrate an example of a wiring board 1 of a first embodiment. In the first embodiment, an insulating layer and a wiring layer of a certain layer in a wiring board in which a plurality of insulating layers and wiring layers are laminated. Partial plan views and a cross-sectional view of the wiring board as described above are illustrated. FIG. 1 is a plan view of a second wiring layer 3B of the wiring board 1. FIG. 2 is a schematic cross-sectional view of the wiring board 1 taken along a line A-A in FIG. 1. Further, FIG. 7 is a plan view of a first wiring layer 3A of the wiring board 1. The wiring board 1 includes a first insulating layer 2A, the first wiring layer 3A that is arranged on the first insulating layer 2A, a second insulating layer 2B that is arranged on the first wiring layer 3A, and the second wiring layer 3B that is arranged on the second insulating layer 2B.

The first wiring layer 3A includes a first plain layer 10A, first openings 5A that penetrate through the first plain layer 10A, reinforcing pads 6A that are arranged inside the first openings 5A, a first signal pad 7A, and a first signal line 22A that is electrically connected to the first signal pad 7A. The first wiring layer 3A is formed by, for example, a semi-additive method.

The first wiring layer 3A includes a first seed layer 11A that is arranged on the first insulating layer 2A, and a first electroplated layer 12A that is arranged on the first seed layer 11A. The first plain layer 10A corresponds to a ground plane or a power plane. The first signal pad 7A and the first signal line 22A are electrically isolated from the first plain layer 10A.

The reinforcing pads 6A are arranged such that, as illustrated in FIG. 7, entire circumferences are surrounded by the first plain layer 10A in a plan view, and arranged inside the first openings 5A while being separated from the first plain layer 10A. The first wiring layer 3A includes the plurality of reinforcing pads 6A and the plurality of first openings 5A, and the reinforcing pads 6A and the first openings 5A are arranged in a lattice manner in a planer view. Intervals between the reinforcing pads 6A and the first plain layer 10A are, for example, about 1 to 10 micrometers (μm).

The first signal pad 7A is arranged such that an entire circumference except for a connection portion of the first signal line 22A is surrounded by the first plain layer 10A in a plan view, and arranged inside the first opening 5A while being separated from the first plain layer 10A. An interval between the first signal pad 7A and the first plain layer 10A is about 1 micrometer (ii) to 10 μm. The first signal line 22A is arranged such that a circumference is surrounded by the first plain layer 10A in a plan view, and arranged inside the first opening 5A while being separated from the first plain layer 10A. An interval between the first signal line 22A and the first plain layer 10A is about 1 μm to 5 μm.

The second wiring layer 3B includes a second plain layer 10B, a second opening 5B that penetrates through the second plain layer 10B, a second signal pad 7B that is arranged inside the second opening 5B, and a second signal line 22B that is electrically connected to the second signal pad 7B. The second wiring layer 3B is also formed by, for example, a semi-additive method.

The second wiring layer 3B includes a second seed layer 11B that is arranged on the second insulating layer 2B, and a second electroplated layer 12B that is arranged on the second seed layer 11B. The second plain layer 10B corresponds to a ground plane or a power plane. The second signal pad 7B and the second signal line 22B are electrically isolated from the second plain layer 10B.

The second signal pad 7B is arranged such that an entire circumference except for a connection portion of the second signal line 22B is surrounded by the second plain layer 10B in a plan view, and arranged inside the second opening 5B while being separated from the second plain layer 10B. An interval between the second signal pad 7B and the second plain layer 10B is about 1 μm to 10 μm. The second signal line 22B is arranged such that a circumference is surrounded by the second plain layer 10B in a plan view, and arranged inside the second opening 5B while being separated from the second plain layer 10B. An interval between the second signal line 22B and the second plain layer 10B is, for example, about 1 μm to 10 μm.

The second insulating layer 2B includes through holes 21, reinforcing vias 20A that connect the reinforcing pads 6A and the second plain layer 10B, and a signal via 20B that electrically connects the first signal pad 7A and the second signal pad 7B. The through holes 21 penetrate from a top surface to a bottom surface of the second insulating layer 2B, and expose surfaces of the reinforcing pads 6A. The reinforcing vias 20A and the reinforcing pads 6A do not come into contact with signal lines. Further, the through hole 21 penetrates from the top surface to the bottom surface of the second insulating layer 2B, and exposes the first signal pad 7A.

Each of the reinforcing vias 20A includes the second seed layer 11B that is arranged on the surface of the second insulating layer 2B, where the surface serves as an inner wall of each of the through holes 21, and the second electroplated layer 12B that is arranged on the second seed layer 11B and that fills each of the through holes 21. Meanwhile, the second electroplated layer 12B of each of the reinforcing vias 20A is a part of the second electroplated layer 12B of the second plain layer 10B of the second wiring layer 3B.

Meanwhile, for convenience of explanation, the example has been illustrated in which a reinforcing pad is not arranged on the second wiring layer 3B, but it may be possible to arrange a reinforcing pad on the second wiring layer 3B and an appropriate change is applicable.

Figure 3:
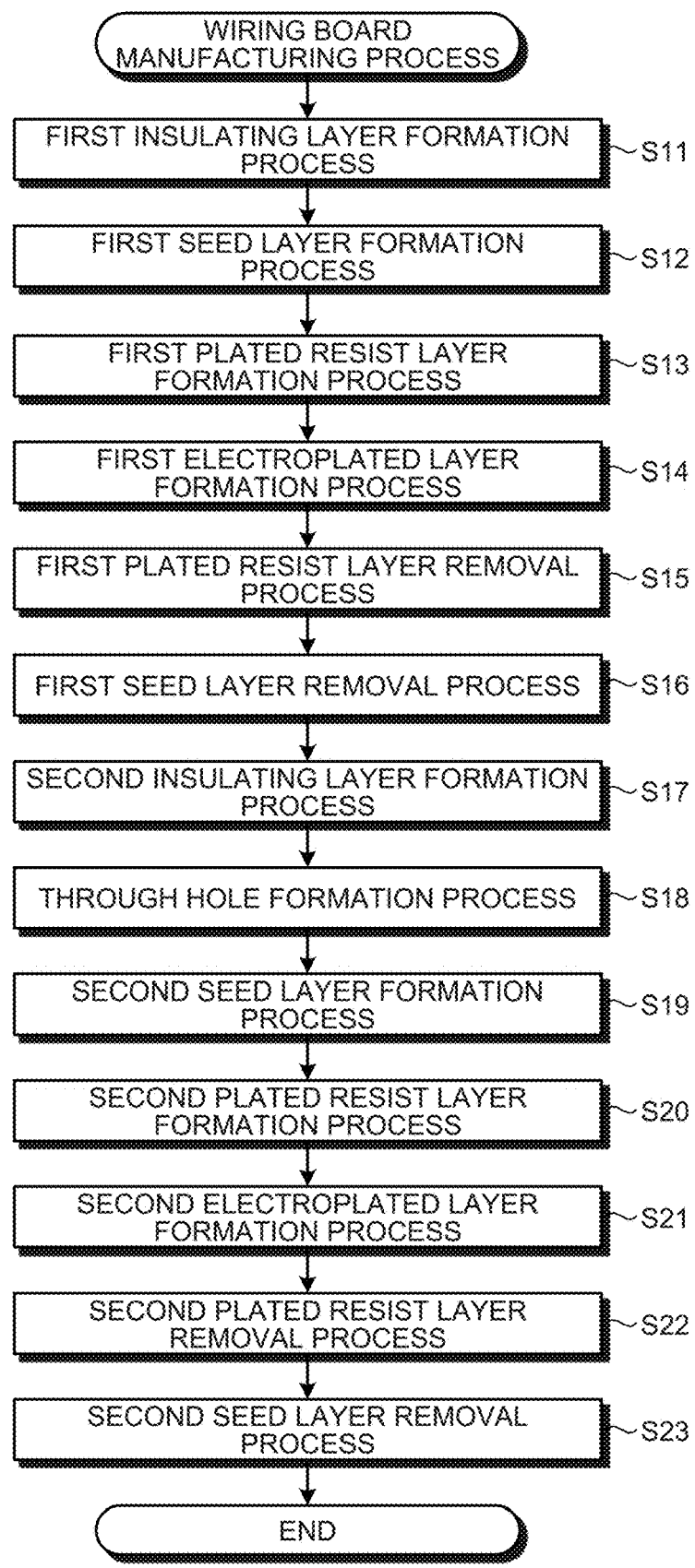
FIG. 3 is a flowchart illustrating an example of a wiring board manufacturing process of the first embodiment.
Figure 4A:
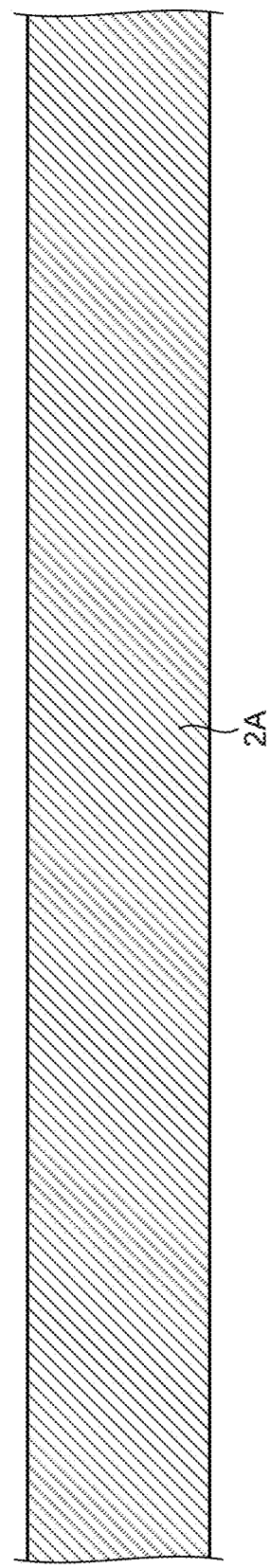
FIG. 4A is an explanatory diagram illustrating an example of a first insulating layer formation process.

FIG. 3 is a flowchart illustrating an example of a wiring board manufacturing process of the first embodiment. As the wiring board manufacturing process illustrated in FIG. 3, a first insulating layer formation process of forming the first insulating layer 2A is performed (Step S11). FIG. 4A is an explanatory diagram illustrating an example of the first insulating layer formation process. For example, the first insulating layer 2A that is made of photosensitive insulating resin is formed. Meanwhile, as the photosensitive insulating resin, for example, phenolic resin or polyimide resin is used.

As the wiring board manufacturing process, after the first insulating layer formation process is performed at Step S11, a first seed layer formation process of forming the first seed layer 11A on the first insulating layer 2A is performed (Step S12). FIG. 4B is an explanatory diagram illustrating an example of the first seed layer formation process. For example, the first seed layer 11A is formed on the surface of the first insulating layer 2A by electroless plating or sputtering. As the first seed layer 11A, for example, copper with a thickness of about 100 nanometers (nm) to 350 nm is used. Meanwhile, it may be possible to form the first seed layer 11A by laminating a copper layer with a thickness of 100 nm to 350 nm on a titanium layer with a thickness of about 20 nm to 50 nm, for example.

As the wiring board manufacturing process, after the first seed layer formation process is performed at Step S12, a first plated resist layer formation process of arranging a first plated resist layer 51A for forming the first wiring layer 3A on the first seed layer 11A is performed (Step S13). FIG. 5A is an explanatory diagram illustrating an example of the first plated resist layer formation process. A dry resist film that is made of photosensitive resin is laminated on the first seed layer 11A, for example. Subsequently, by exposing and developing the dry resist film, the first plated resist layer 51A that includes openings 51C and that corresponds to a planar shape of the first wiring layer 3A is formed. Accordingly, a part of the surface of the first seed layer 11A is exposed from the openings 51C.

As the wiring board manufacturing process, after the first plated resist layer formation process is performed at Step S13, a first electroplated layer formation process of forming the first electroplated layer 12A on the first seed layer 11A is performed (Step S14). FIG. 5B is an explanatory diagram illustrating an example of the first electroplated layer formation process. In the first electroplated layer formation process, an electroplating process is performed by using the first seed layer 11A as a power supply layer. As a result, plate deposition is performed on the first seed layer 11A that is exposed from the openings 51C of the first plated resist layer 51A, and the first electroplated layer 12A is formed on the first seed layer 11A. Meanwhile, the first electroplated layer 12A is formed by, for example, electrolytic copper plating. A thickness of the first electroplated layer 12A is set to, for example, about 1 μm to 5 μm. Meanwhile, the first electroplated layer 12A that serves as the first signal pad 7A, the first electroplated layer 12A that serves as the first plain layer 10A, and the first electroplated layer 12A that serves as the reinforcing pads 6A in the first wiring layer 3A are formed of the same electroplated copper layer.

As the wiring board manufacturing process, after the first electroplated layer formation process is performed at Step S14, a first plated resist layer removal process of removing the first plated resist layer 51A on the first seed layer 11A is performed (Step S15). FIG. 6A is an explanatory diagram illustrating an example of the first plated resist layer removal process. In the first plated resist layer removal process, the first plated resist layer 51A on the first seed layer 11A is removed by a plating resist stripper.

Figure 6B:
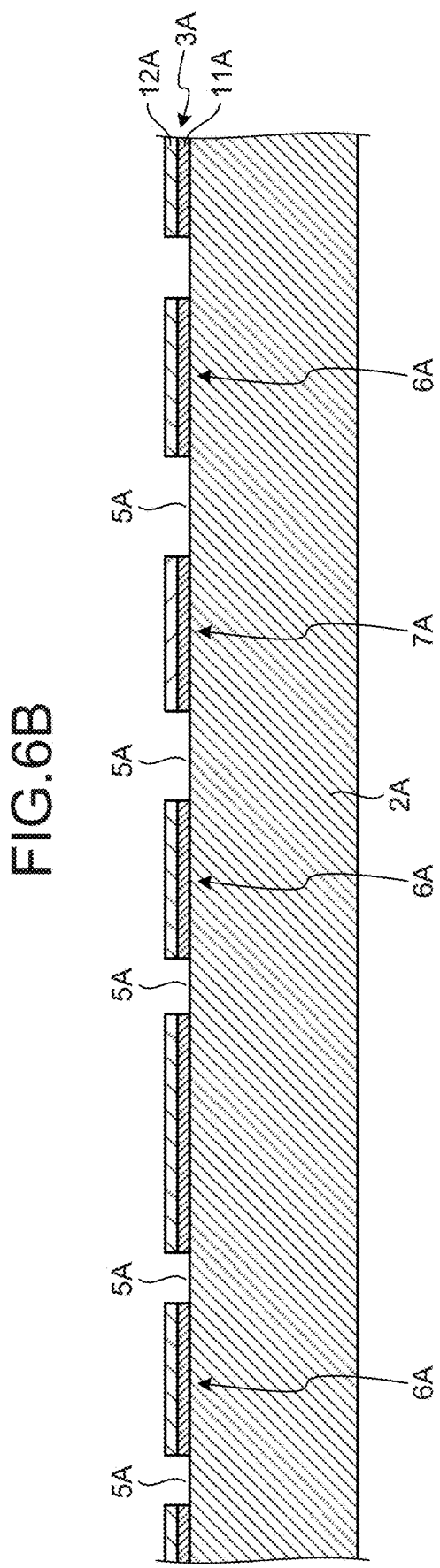
FIG. 6B is an explanatory diagram illustrating an example of a first seed layer removal process.

As the wiring board manufacturing process, after the first plated resist layer removal process is performed at Step S15, a first seed layer removal process of removing the first seed layer 11A exposed from the first electroplated layer 12A is performed (Step S16). FIG. 6B is an explanatory diagram illustrating an example of the first seed layer removal process. In the first seed layer removal process, the first seed layer 11A exposed from the first electroplated layer 12A is removed by etching by using the first electroplated layer 12A as a mask. For example, the removal is performed by wet etching. As a result, the first wiring layer 3A that is formed of the first seed layer 11A and the first electroplated layer 12A is formed on the first insulating layer 2A. FIG. 7 is a schematic plan view illustrating an example of the first wiring layer 3A. A line/space of the first wiring layer 3A are set to, for example, about 1 μm/1 μm to 5 μm/5 μm. Diameters of the first signal pad 7A and the reinforcing pads 6A in the first wiring layer 3A are set to, for example, about 10 μm to 30 μm. An interval between each of the first signal pad 7A and the reinforcing pads 6A and the first plain layer 10A is set to, for example, about 1 μm to 10 μm.

If the wiring board 1 is manufacture by a build-up method, the insulating layer is subjected to a heating process a plurality of number of times, and therefore, gas is generated from the insulating layer due to thermal curing. The gas may be accumulated between the plain layer (wiring layer) and the insulating layer, and the plain layer and the insulating layer may be separated from each other. However, in the present embodiment, it is possible to allow the gas to escape from the first openings 5A of the first plain layer 10A around the reinforcing pads 6A. As a result, for example, it is possible to prevent separation between the first plain layer 10A in the first wiring layer 3A and each of the first insulating layer 2A and the second insulating layer 2B.

As the wiring board manufacturing process, after the first seed layer removal process is performed at Step S16, a second insulating layer formation process of forming the second insulating layer 2B on the first wiring layer 3A is performed (Step S17). FIG. 8A is an explanatory diagram illustrating an example of the second insulating layer formation process. In the second insulating layer formation process, for example, heating is performed in a state in which photosensitive insulating resin in a liquid form or in a paste form is applied onto the first wiring layer 3A. As a result, the second insulating layer 2B in a semi-cured state is formed on the first wiring layer 3A. As the photosensitive insulating resin, for example, phenolic resin or polyimide resin is used. A thickness of the second insulating layer 2B is set to, for example, about 5 μm to 10 μm.

Figure 8B:
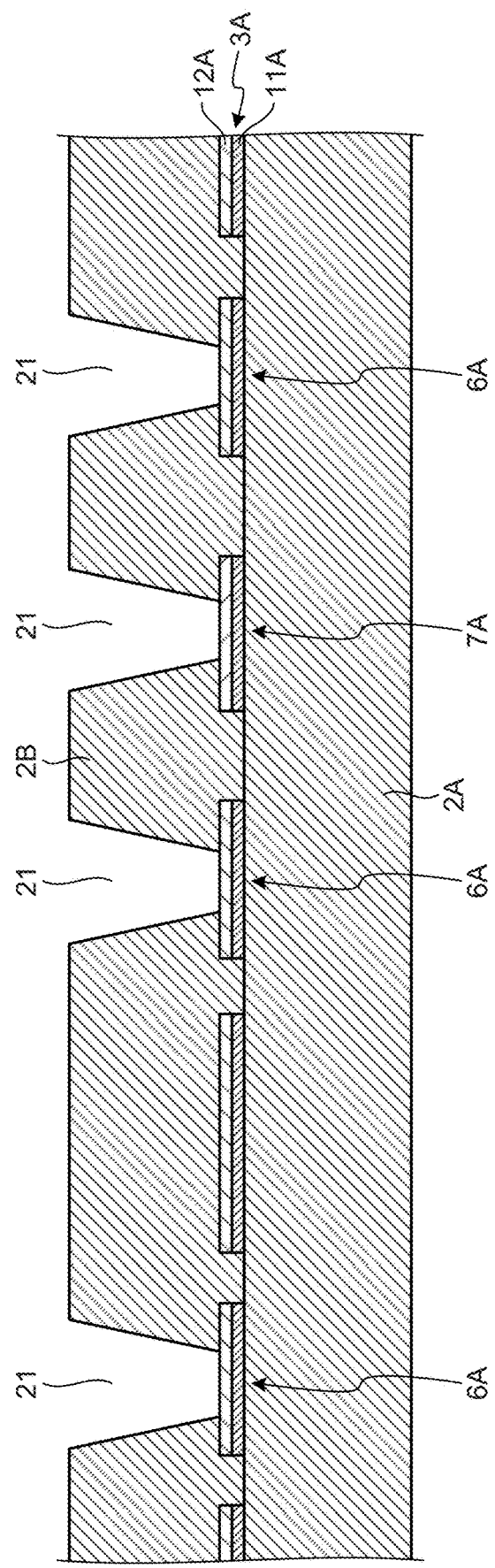
FIG. 8B is an explanatory diagram illustrating an example of a through hole formation process.

As the wiring board manufacturing process, after the second insulating layer formation process is performed at Step S17, a through hole formation process of forming the through holes 21 for exposing surfaces of the reinforcing pads 6A and the first signal pad 7A in the second insulating layer 2B is performed (Step S18). FIG. 8B is an explanatory diagram illustrating an example of the through hole formation process. In the through hole formation process, for example, by exposure and development on the second insulating layer 2B that is made of photosensitive resin, the through holes 21 that penetrate from the top surface to the bottom surface of the second insulating layer 2B and that expose a part of the surface of the first wiring layer 3A is formed on the second insulating layer 2B. Thereafter, the second insulating layer 2B is heated to be cured at temperature that is equal to or higher than curing temperature of the photosensitive resin. Meanwhile, each of the through holes 21 is formed in an inverted truncated cone shape in which an opening diameter on the surface at the side of the second insulating layer 2B is larger than an opening diameter on the surface at the side of the first wiring layer 3A. The opening diameter on the surface of the second insulating layer 2B is set to, for example, about 5 μm to 20 μm.

As the wiring board manufacturing process, after the through hole formation process is performed at Step S18, a second seed layer formation process of forming the second seed layer 11B on the second insulating layer 2B is performed (Step S19). FIG. 9A is an explanatory diagram illustrating an example of the second seed layer formation process. In the second seed layer formation process, the second seed layer 11B is formed on the surface of the second insulating layer 2B including inner walls of the through holes 21 and the surface of the first wiring layer 3A exposed from the through holes 21 by, for example, electroless plating or sputtering. As the second seed layer 11B, for example, copper with a thickness of about 100 nm to 350 nm is used. Meanwhile, it may be possible to form the second seed layer 11B by laminating a copper layer with a thickness of 100 nm to 300 nm on a titanium layer with a thickness of about 20 nm to 50 nm, for example.

Figure 9B:
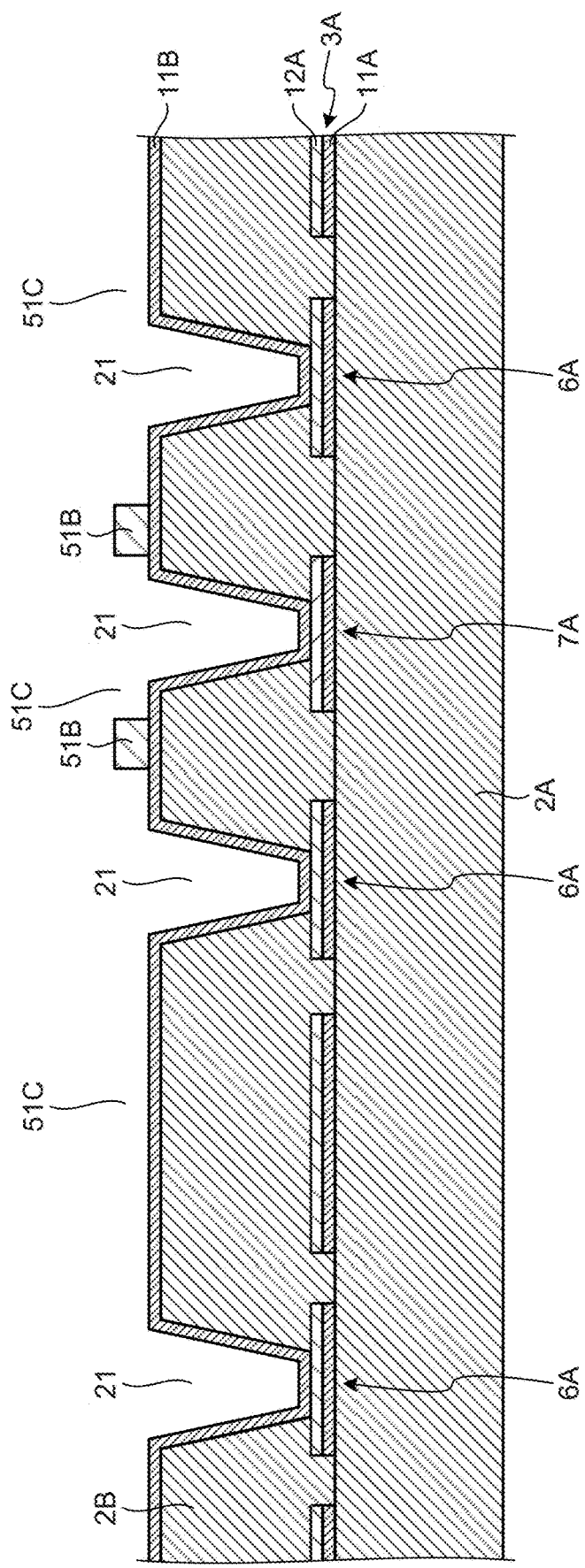
FIG. 9B is an explanatory diagram illustrating an example of a second plated resist layer formation process.

As the wiring board manufacturing process, after the second seed layer formation process is performed at Step S19, a second plated resist layer formation process of forming a second plated resist layer 51B on the second seed layer 11B is performed (Step S20). FIG. 9B is an explanatory diagram illustrating an example of the second plated resist layer formation process. In the second plated resist layer formation process, the second plated resist layer 51B with photosensitivity is formed on the second seed layer 11B. For example, by performing exposure and development in the same method as the first plated resist layer 51A, the second plated resist layer 51B that includes the openings 51C and that corresponds to a planar shape of the second wiring layer 3B is formed. Accordingly, a part of the surface of the second seed layer 11B is exposed from the openings 51C.

Figure 10:
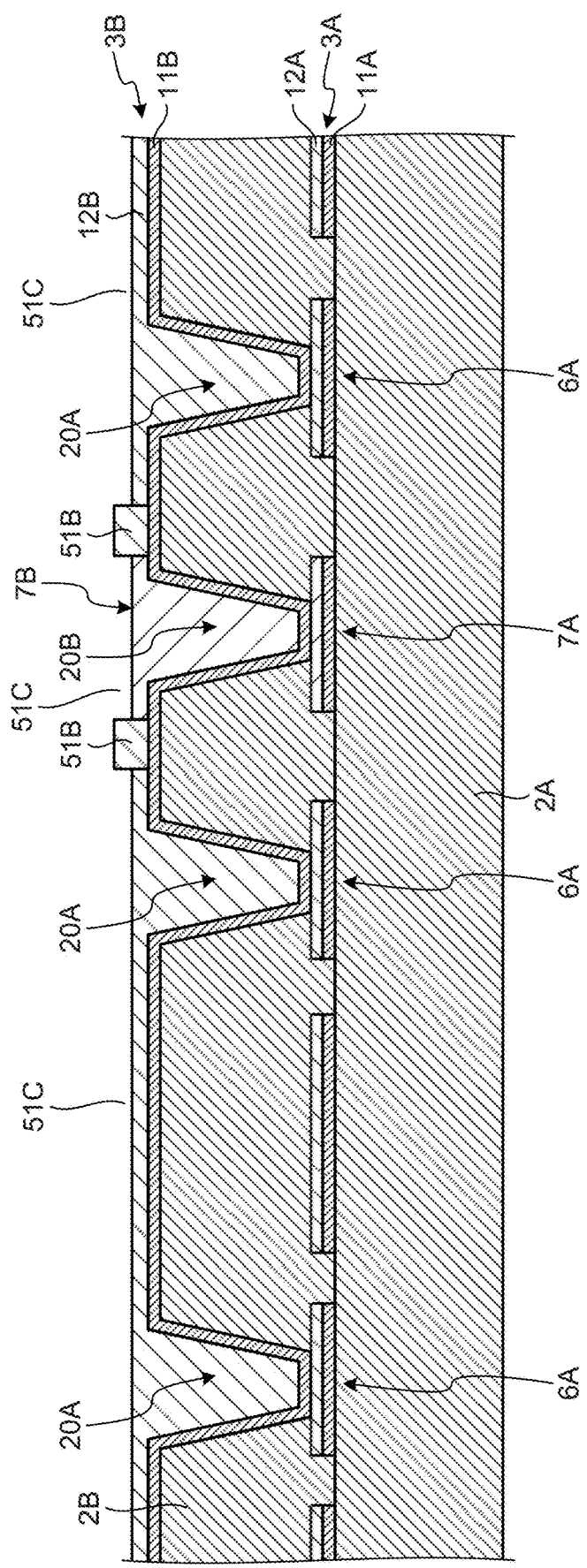
FIG. 10 is an explanatory diagram illustrating an example of a second electroplated layer formation process.

As the wiring board manufacturing process, after the second plated resist layer formation process is performed at Step S20, a second electroplated layer formation process of forming the second electroplated layer 12B on the second seed layer 11B is performed (Step S21). FIG. 10 is an explanatory diagram illustrating an example of the second electroplated layer formation process. In the second electroplated layer formation process, an electroplating process is performed by using the second seed layer 11B as a power supply layer. As a result, plate deposition is performed on the second seed layer 11B that is exposed from the openings 51C of the second plated resist layer 51B, and the second electroplated layer 12B is formed on the second seed layer 11B. The second electroplated layers 12B is formed by, for example, electrolytic copper plating. A thickness of the second electroplated layer 12B (thickness on the surface of the insulating layer) is set to, for example, about 1 μm to 3 μm. By forming the second electroplated layer 12B so as to fill the through holes 21, the reinforcing vias 20A and the signal via 20B are formed in the second insulating layer 2B. In the second wiring layer 3B, the second electroplated layer 12B as a portion serving as the second signal pad 7B or the like and the second electroplated layer 12B as a portion serving as the second plain layer 10B are formed of the same second electroplated layer 12B.

Figure 11:
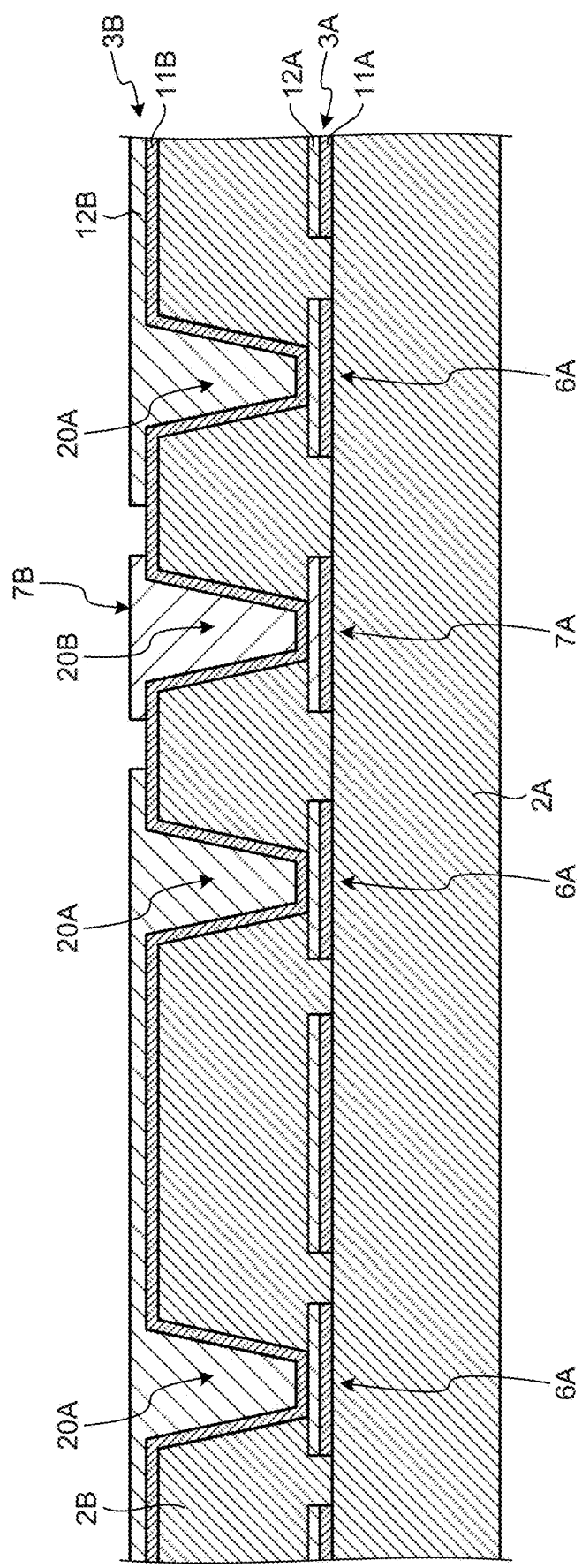
FIG. 11 is an explanatory diagram illustrating an example of a second plated resist layer removal process.

As the wiring board manufacturing process, after the second electroplated layer formation process is performed at Step S21, a second plated resist layer removal process of removing the second plated resist layer 51B on the second seed layer 11B is performed (Step S22). FIG. 11 is an explanatory diagram illustrating an example of the second plated resist layer removal process. In the second plated resist layer removal process, the second plated resist layer 51B on the second seed layer 11B is removed by a plating resist stripper.

Figure 12:
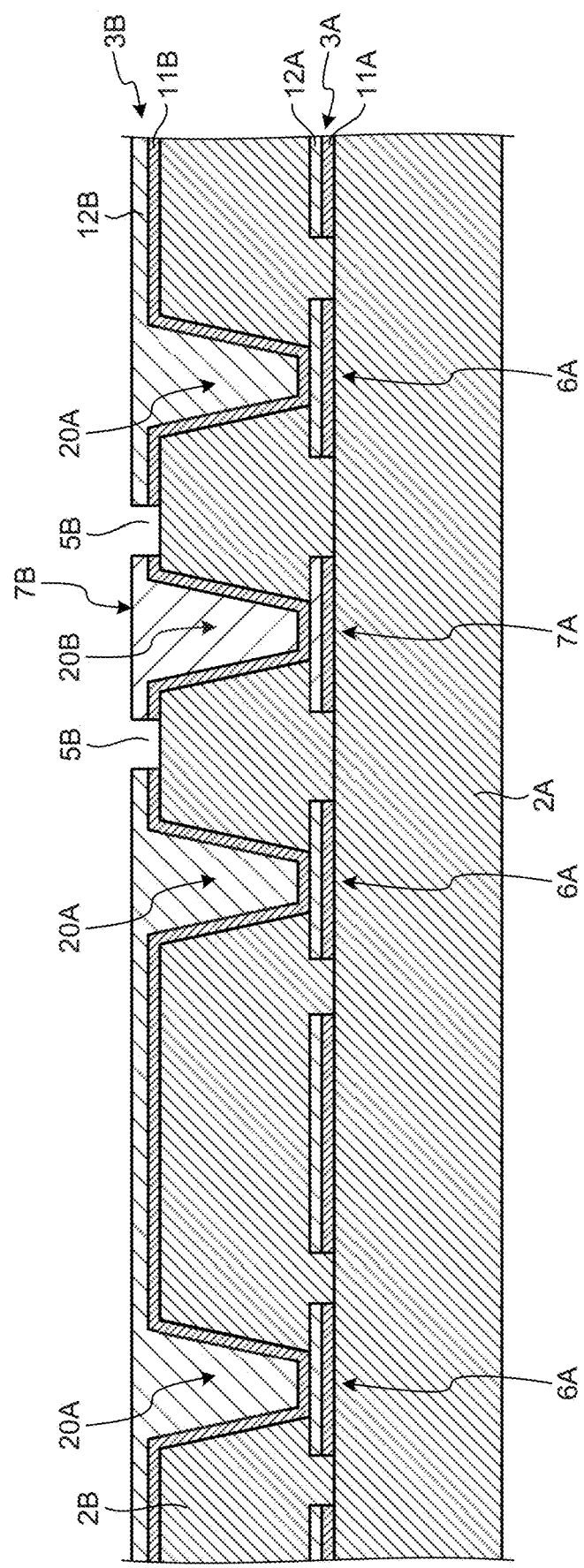
FIG. 12 is an explanatory diagram illustrating an example of a second seed layer removal process.

As the wiring board manufacturing process, after the second plated resist layer removal process is performed at Step S22, a second seed layer removal process of removing the second seed layer 11B exposed from the second electroplated layer 12B is performed (Step S23). FIG. 12 is an explanatory diagram illustrating an example of the second seed layer removal process. In the second seed layer removal process, the second seed layer 11B exposed from the second electroplated layer 12B is removed by etching by using the second electroplated layer 12B as a mask. For example, the removal is performed by wet etching. As a result, the second wiring layer 3B that is formed of the second seed layer 11B and the second electroplated layer 12B is formed. A line/space of the second wiring layer 3B is set to, for example, about 1 μm/1 μm to 5 μm/5 μm. A diameter of the second signal pad 7B is set to, for example, about 10 μm to 30 μm. An interval between the second signal pad 7B and the second plain layer 10B is set to, for example, about 1 μm to 10 μm.

As a result, a plain layer portion of the wiring board 1 including the first insulating layer 2A, the first wiring layer 3A, the second insulating layer 2B, and the second wiring layer 3B is completed. In other words, in the wiring board 1, the reinforcing vias 20A and the signal via 20B are formed by the same electroplated layer 12B in the second insulating layer 2B through the second electroplated layer formation process, so that an additional process of forming the reinforcing vias 20A is not needed.

Figure 13:
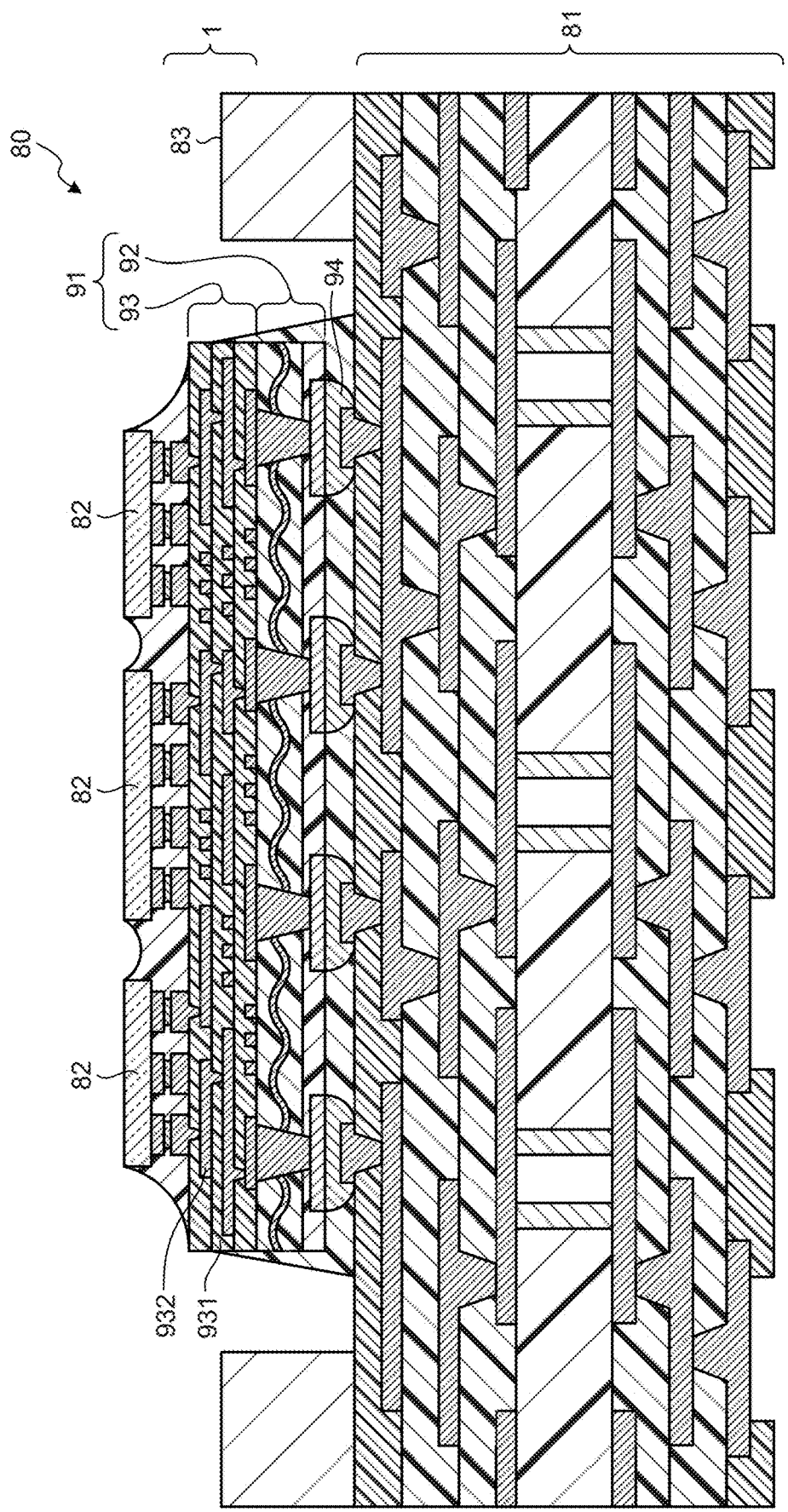
FIG. 13 is an explanatory diagram illustrating an example of a semiconductor device.

The structure of in the wiring board 1 of the first embodiment is applicable to various kinds of wiring boards and semiconductor devices using the wiring boards. For example, the structure is applicable to a wiring board and a semiconductor device disclosed in Japanese Laid-open Patent Publication No. 2020-047735. FIG. 13 is an explanatory diagram illustrating an example of the semiconductor device disclosed in Japanese Laid-open Patent Publication No. 2020-047735. A semiconductor device 80 illustrated in FIG. 13 includes a base substrate 81, a stiffener 83 that reinforces the base substrate 81, a wiring board 91 that is mounted on the base substrate 81 via bumps 94, and semiconductor chips 82 that are mounted on the wiring board 91. The wiring board 91 includes an insulating layer 92, in which non-photosensitive thermosetting resin is impregnated in a reinforcing member, such as a glass cloth, and a multi-layer wiring structure 93 that is arranged on the insulating layer 92. The multi-layer wiring structure 93 is formed by repeatedly laminating an insulating layer 931 that is made of photosensitive resin and a wiring layer 932 that is formed by a semi-additive method. Structures of the plain layer, the reinforcing pad, and the reinforcing via of the wiring board 1 is applicable to the multi-layer wiring structure 93. Therefore, in the semiconductor device 80, it is possible to use the wiring board 91 in which adhesion between the insulating layer 931 and the wiring layer 932 is increased.

In the wiring board 1 of the first embodiment, the reinforcing vias 20A that connect the reinforcing pads 6A arranged in the first openings 5A in the first wiring layer 3A and the second plain layer 10B in the second wiring layer 3B are formed in the second insulating layer 2B. In other words, in the wiring board 1, a structure in which the top surface and the bottom surface of the second insulating layer 2B are sandwiched between the second plain layer 10B and the reinforcing pads 6A with use of the reinforcing vias 20A and the reinforcing pads 6A. As a result, it is possible to prevent the second plain layer 10B from being separated from the second insulating layer 2B. Further, by increasing adhesion between the wiring layer and the insulating layer, it is possible to prevent delamination between the wiring layer and the insulating layer.

The reinforcing pads 6A are arranged in the first openings 5A such that entire circumferences of the reinforcing pads 6A are surrounded by the first plain layer 10A and the reinforcing pads 6A are separated from the first plain layer 10A. As a result, it is possible to allow gas that is generated due to thermal curing of resin of the first insulating layer 2A to escape from the first openings 5A in the first plain layer 10A around the reinforcing pads 6A. As a result, it is possible to prevent separation between the first plain layer 10A and the first insulating layer 2A.

The first wiring layer 3A includes the plurality of reinforcing pads 6A and the plurality of first openings 5A, and the reinforcing pads 6A and the first openings 5A are arranged in a lattice manner in a plan view. As a result, it is possible to prevent unevenness of adhesion between the wiring layer and the insulating layer.

The second insulating layer 2B includes the signal via 20B that electrically connects the first signal pad 7A and the second signal pad 7B. As a result, it is possible to electrically connect the first wiring layer 3A and the second wiring layer 3B.

The second insulating layer 2B includes the through holes 21 that penetrate through a top surface and a bottom surface of the second insulating layer 2B and that expose the surfaces of the reinforcing pads 6A. The second plain layer 10B and the reinforcing vias 20A include the second seed layer 11B, which is arranged on the surface of the second insulating layer 2B on the inner walls of the through holes 21 and the surfaces of the reinforcing pads 6A, and the second electroplated layer 12B, which is arranged on the second seed layers 11B and which fills the through holes 21. As a result, adhesion between the wiring layer and the insulating layer is increased, so that it is possible to prevent delamination between the wiring layer and the insulating layer.

In the wiring board 1, the reinforcing vias 20A are formed in the second insulating layer 2B between the reinforcing pads 6A of the first wiring layer 3A and the second wiring layer 3B. As a result, it is possible to increase adhesion between the first wiring layer 3A and the first insulating layer 2A (the second insulating layer 2B) and between the second wiring layer 3B and the second insulating layer 2B.

Furthermore, the reinforcing vias 20A are arranged at equal intervals (about 100 μm to 500 μm) in the second insulating layer 2B on the first wiring layer 3A, so that it is possible to prevent unevenness of adhesion between the wiring layer and the insulating layer.

Moreover, the case has been described in which, in the wiring board 1 of the first embodiment, the two wiring layers 3A (3B) are mounted, but the number of wiring layers is not limited to two, and it may be possible to mount three or more wiring layers. This embodiment will be described below as a second embodiment.

Second Embodiment

Figure 14:
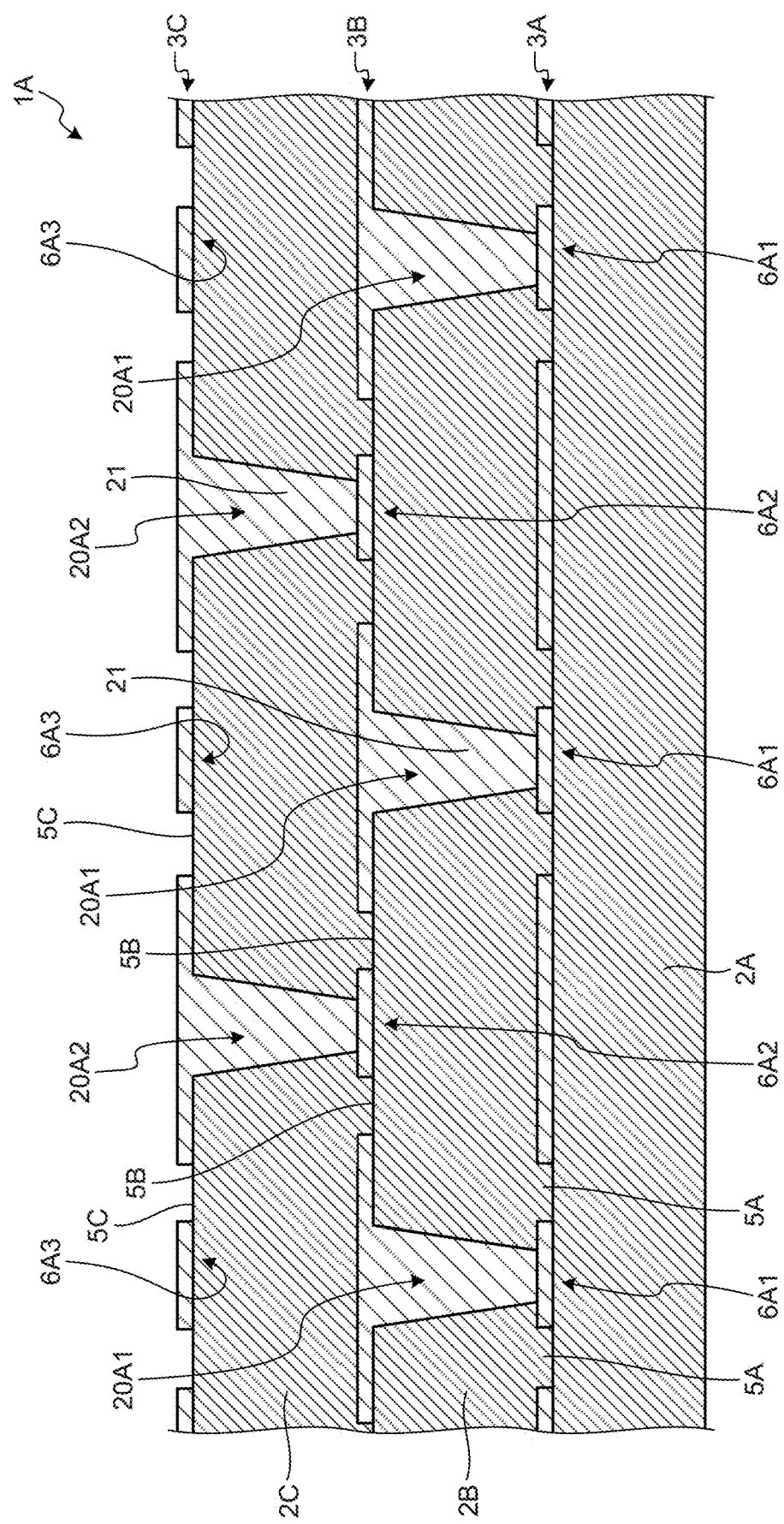
FIG. 14 is a schematic cross-sectional view illustrating an example of a wiring board of a second embodiment.

FIG. 14 is a schematic cross-sectional view illustrating an example of a wiring board 1A of the second embodiment. Meanwhile, the same components as those of the wiring board 1 of the first embodiment are denoted by the same reference symbols, and explanation of the same configuration and the same operation will be omitted. The wiring board 1A illustrated in FIG. 14 includes the first insulating layer 2A, the first wiring layer 3A, the second insulating layer 2B, the second wiring layer 3B, a third insulating layer 2C, and a third wiring layer 3C. The first wiring layer 3A is arranged on the first insulating layer 2A. The second insulating layer 2B is arranged on the first wiring layer 3A. The second wiring layer 3B is arranged on the second insulating layer 2B. The third insulating layer 2C is arranged on the second wiring layer 3B. The third wiring layer 3C is arranged on the third insulating layer 2C. Meanwhile, for convenience of explanation, a signal pad and a signal via are omitted.

FIG. 15A is a schematic plan view illustrating an example of the first wiring layer 3A. The first wiring layer 3A illustrated in FIG. 15A includes the first plain layer 10A, the plurality of first openings 5A, and a plurality of first reinforcing pads 6A1. The plurality of first openings 5A and the plurality of first reinforcing pads 6A1 are arranged in a lattice manner. The first wiring layer 3A includes the first seed layer 11A and the first electroplated layer 12A. Meanwhile, in FIG. 14, illustration of the first seed layer 11A and the first electroplated layer 12A is omitted and the first wiring layer 3A is illustrated as a single layer. Furthermore, for convenience of explanation, in FIG. 15A, second reinforcing pads 6A2 of the second wiring layer 3B located above the first wiring layer 3A are indicated by dotted-lines, but the second reinforcing pads 6A2 are not arranged on the first wiring layer 3A.

FIG. 15B is a schematic plan view illustrating an example of the second wiring layer 3B. The second wiring layer 3B illustrated in FIG. 15B includes the second plain layer 10B, the plurality of second openings 5B, and the plurality of second reinforcing pads 6A2. The plurality of second openings 5B and the plurality of second reinforcing pads 6A2 are arranged in a lattice manner. The second wiring layer 3B includes the second seed layer 11B and the second electroplated layer 12B. Meanwhile, in FIG. 14, illustration of the second seed layer 11B and the second electroplated layer 12B is omitted, and the second wiring layer 3B is illustrated as a single layer. Furthermore, for convenience of explanation, in FIG. 15B, third reinforcing pads 6A3 of the third wiring layer 3C located above the second wiring layer 3B and the first reinforcing pads 6A1 of the first wiring layer 3A located below the second wiring layer 3B are indicated by dotted-lines. However, the first reinforcing pads 6A1 and the third reinforcing pads 6A3 are not arranged on the second wiring layer 3B.

FIG. 15C is a schematic plan view illustrating an example of the third wiring layer 3C. The third wiring layer 3C illustrated in FIG. 15C includes a third plain layer 10C, a plurality of third openings 5C, and the plurality of third reinforcing pads 6A3. The plurality of third openings 5C and the plurality of third reinforcing pads 6A3 are arranged in a lattice manner. The third wiring layer 3C includes a third seed layer 11C and a third electroplated layer 12C. Meanwhile, in FIG. 14, illustration of the third seed layer 11C and the third electroplated layer 12C is omitted, and the third wiring layer 3C is illustrated as a single layer. Furthermore, for convenience of explanation, in FIG. 15C, the second reinforcing pads 6A2 of the second wiring layer 3B located below the third wiring layer 3C are indicated by dotted-lines. However, the second reinforcing pads 6A2 are not arranged on the third wiring layer 3C.

In the wiring board 1A, when the first wiring layer 3A, the second wiring layer 3B, and the third wiring layer 3C are laminated, the first reinforcing pads 6A1 in the first wiring layer 3A and the third reinforcing pads 6A3 in the third wiring layer 3C are arranged at overlapping positions in a plan view.

The second insulating layer 2B includes the through holes 21 that penetrate through the second insulating layer 2B and that expose surfaces of the first reinforcing pads 6A1, and first reinforcing vias 20A1 that connect the first reinforcing pads 6A1 and the second plain layer 10B.

The third insulating layer 2C includes the through holes 21 that penetrate through the third insulating layer 2C and that expose surfaces of the second reinforcing pads 6A2, and second reinforcing vias 20A2 that connect the second reinforcing pads 6A2 and the third plain layer 10C.

In the wiring board 1A of the second embodiment, when the first insulating layer 2A, the second insulating layer 2B, and the third insulating layer 2C are laminated, the positions of the first reinforcing vias 20A1 in the second insulating layer 2B and the positions of the second reinforcing vias 20A2 in the third insulating layer 2C do not overlap with each other. In other words, arrangement of the reinforcing pads 6A and the reinforcing vias 20A in a certain plain layer and arrangement of the reinforcing pads 6A and the reinforcing vias 20A in a layer above the certain layer are inverted from each other. As a result, it is possible to prevent unevenness of adhesion between the wiring layer and the insulating layer.

In the wiring board 1A of the second embodiment, the case is illustrated in which the three wiring layers are laminated, but the number of the wiring layers is not limited to three and may be four or more, and an appropriate change is applicable. In this case, the positions of the first reinforcing vias 20A1 in the second insulating layer between a first wiring layer and a second wiring layer and positions of third reinforcing vias in a fourth insulating layer between a third wiring layer and a fourth wiring layer may overlap with each other. Furthermore, the first reinforcing vias 20A1 and the third reinforcing vias need not overlap with each other, and the positions of the reinforcing vias 20A may be appropriately changed.

Meanwhile, in the wiring board 1 of the first embodiment, the case has been illustrated in which the reinforcing pads 6A are arranged in the first openings 5A of the first plain layer 10A such that entire circumferences of the reinforcing pads 6A are surrounded. However, the reinforcing pads 6A need not always be arranged in the first openings 5A. The reinforcing pads 6A may be arranged in the first plain layer 10A, and this embodiment will be described below as a third embodiment.

Third Embodiment

Figure 16:
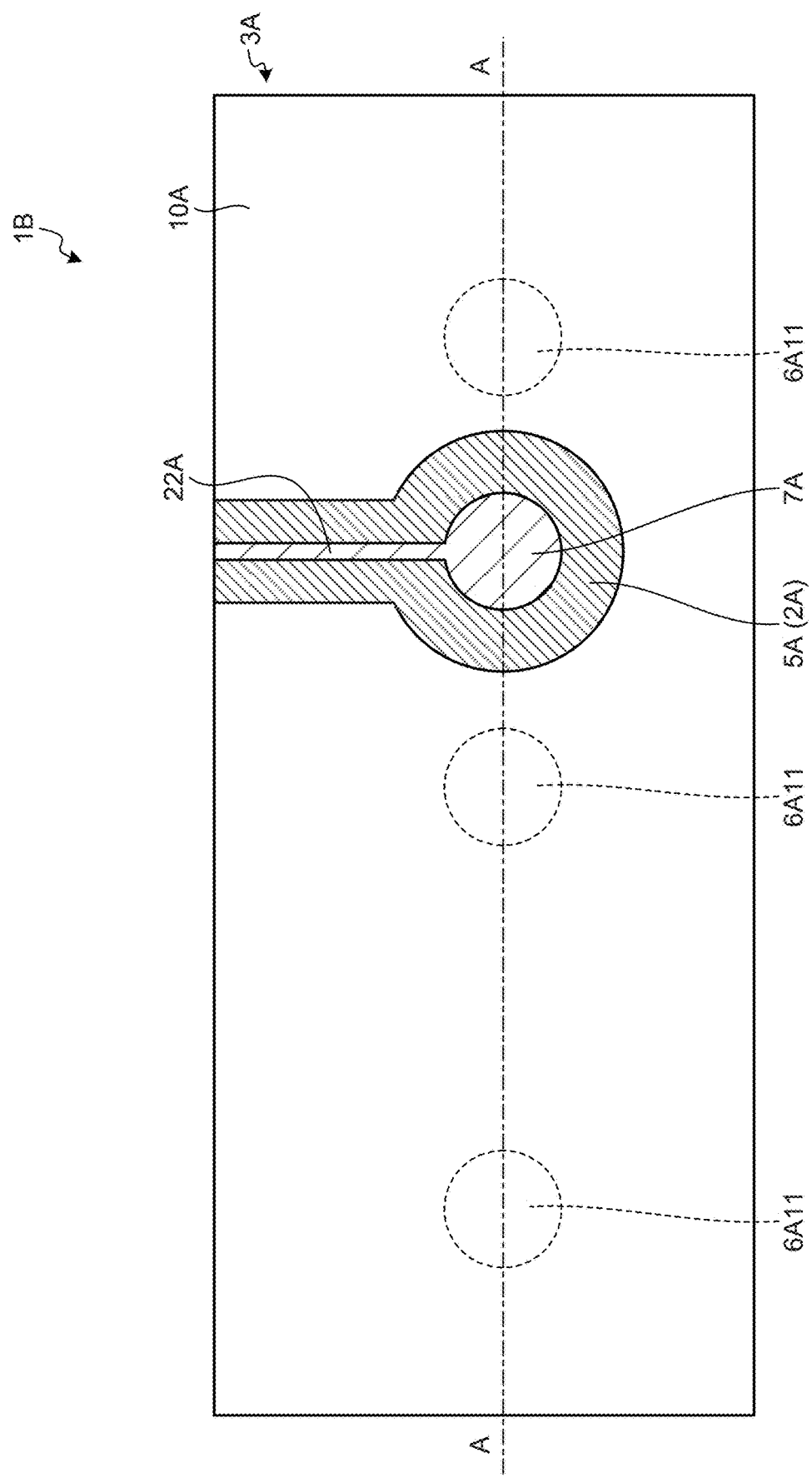
FIG. 16 is a schematic plan view illustrating an example of a wiring board of a third embodiment.
Figure 17:
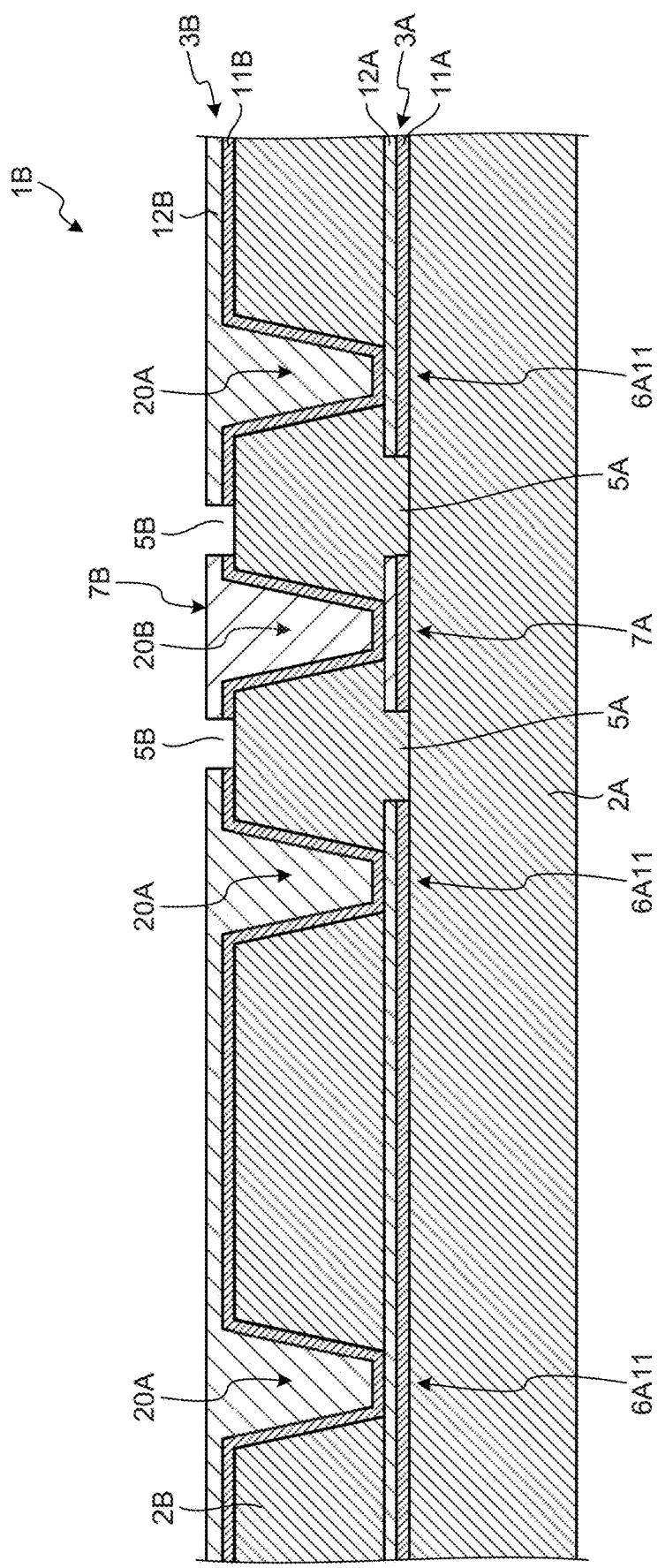
FIG. 17 is a schematic cross-sectional view taken along a line A-A in FIG. 16.
Figure 18:
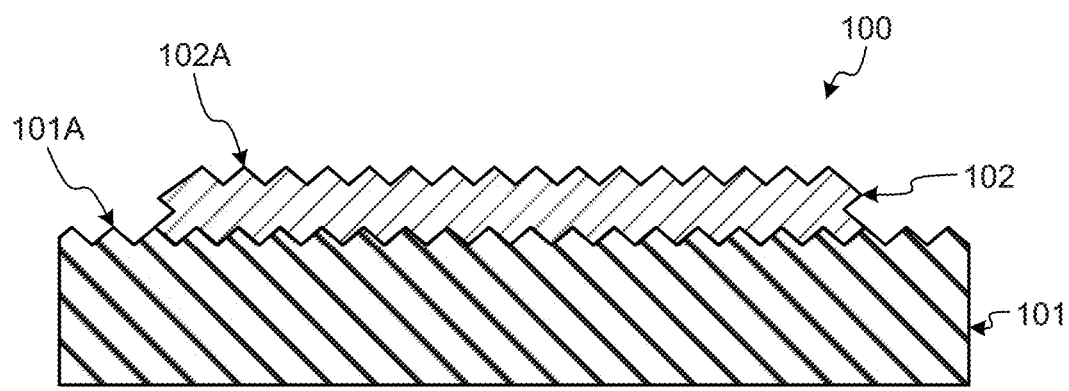
FIG. 18 is an explanatory diagram illustrating an example of a conventional wiring board.

FIG. 16 is a schematic plan view illustrating an example of a wiring board 1B of the third embodiment. A plan view of the first wiring layer 3A in the wiring board 1B is illustrated. FIG. 17 is a schematic cross-sectional view taken along a line A-A in FIG. 16. Meanwhile, the same components as those of the wiring board 1 of the first embodiment are denoted by the same reference symbols, and explanation of the same configuration and the same operation will be omitted. The wiring board 1B of the third embodiment is different from the wiring board 1 of the first embodiment in that reinforcing pads 6A11 are arranged in portions of the first plain layer 10A other than the first openings 5A.

The reinforcing pads 6A11 in the first wiring layer 3A are arranged in the first plain layer 10A. In other words, the reinforcing pads 6A11 and the first plain layer 10A are formed in an integrated manner. In the second insulating layer 2B, the reinforcing vias 20A that connect the reinforcing pads 6A11 and the second plain layer 10B in the second wiring layer 3B are formed.

In the wiring board 1B of the third embodiment, the reinforcing vias 20A that connect the reinforcing pads 6A11 formed in the first plain layer 10A in the first wiring layer 3A and the second plain layer 10B in the second wiring layer 3B are formed in the second insulating layer 2B. As a result, adhesion between the wiring layer and the insulating layer is increased, so that it is possible to prevent delamination between the wiring layer and the insulating layer.

Meanwhile, the case has been illustrated in which the wiring layers, such as the first wiring layer 3A and the second wiring layer 3B, are formed by the semi-additive method, but embodiments are not limited to this example, and the wiring layers may be formed by a different method, such as the full-additive method.

According to one embodiment of the wiring board disclosed in the present application, it is possible to increase adhesion between the insulating layer and the wiring layer.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A wiring board comprising:
a first wiring layer;
an insulating layer that is arranged on the first wiring layer; and
a second wiring layer that is arranged on the insulating layer, wherein
the first wiring layer includes
a first plain layer;
a first signal pad;
a first signal line that is electrically connected to the first signal pad;
an opening that penetrates through the first plain layer; and
a reinforcing pad that is arranged inside the opening,
the second wiring layer includes
a second plain layer:
a second signal pad; and
a second signal line that is electrically connected to the second signal pad; and
the insulating layer includes
a reinforcing via that connects the reinforcing pad and the second plain layer; and
a signal via that electrically connects the first signal pad and the second signal pad; and
the reinforcing via and the reinforcing pad do not come into contact with the first signal line and the second signal line.
2. The wiring board according to claim 1, wherein the reinforcing pad is arranged in the opening such that an entire circumference of the reinforcing pad is surrounded by the first plain layer and the reinforcing pad is separated from the first plain layer.

3. The wiring board according to claim 1, wherein,
the first wiring layer includes a plurality of reinforcing pad and a plurality of the opening, and
the plurality of the reinforcing pad and the plurality of the opening are arranged in a lattice manner in a plan view.

4. The wiring board according to claim 1, wherein the first plain layer and the second plain layer include one of a ground plane and a power plane.

5. The wiring board according to claim 1, wherein
the insulating layer includes a through hole that penetrates through the insulating layer and that exposes a surface of the reinforcing pad, and
each of the second plain layer and the reinforcing via includes
a seed layer that is arranged on a surface of the insulating layer including an inner wall of the through hole and on a surface of the reinforcing pad, and
an electroplated layer that is arranged on the seed layer and that fills the through hole.

6. The wiring board according to claim 1, wherein the second wiring layer includes:
a different opening that penetrates through the second plain layer; and
a different reinforcing pad that is arranged in the different opening.

7. The wiring board according to claim 6, further including:
a different insulating layer that is arranged on the second wiring layer; and
a third wiring layer that is arranged on the different insulating layer, wherein
the third wiring layer includes a third plain layer, and
the different insulating layer includes a different reinforcing via that connects the different reinforcing pad and the third plain layer.

8. A semiconductor device comprising:
a wiring board that includes
a first wiring layer;
an insulating layer that is arranged on the first wiring layer; and
a second wiring layer that is arranged on the insulating layer; and
a semiconductor chip that is mounted on the wiring board, wherein
the first wiring layer includes
a first plain layer;
a first signal pad;
a first signal line that is electrically connected to the first signal pad;
an opening that penetrates through the first plain layer; and
a reinforcing pad that is arranged inside the opening, the second wiring layer includes
a second plain layer;
a second signal pad;
a second signal line that is electrically connected to the second signal pad; and
the insulating layer includes
a reinforcing via that connects the reinforcing pad and the second plain layer; and
a signal via that electrically connects the first signal pad and the second signal pad; and
the reinforcing via and the reinforcing pad do not come into contact with the first signal line and the second signal line.

9. A wiring board manufacturing method comprising:
forming a first wiring layer that includes a first plain layer, a first signal pad, a first signal line that is electrically connected to the first signal pad, an opening that penetrates through the first plain layer, and a reinforcing pad that is arranged inside the opening;
forming an insulating layer on the first wiring layer;
forming a through hole that exposes a surface of the reinforcing pad in the insulating layer; and
forming a second wiring layer including a second plain layer, a second signal pad, and a second signal line that is electrically connected to the second signal pad on the insulating layer, wherein
the forming the second wiring layer includes forming a reinforcing via that connects the reinforcing pad and the second plain layer in the through hole, and a signal via that electrically connects the first signal pad and the second signal pad, wherein the reinforcing via and the reinforcing pad do not come into contact with the first signal line and the second signal line.

10. The wiring board manufacturing process according to claim 9, wherein
the forming the second wiring layer includes:
forming a seed layer on a surface of the insulating layer including an inner wall of the through hole and a surface of the reinforcing pad;
forming a plated mask pattern on the seed layer;
forming an electroplated layer on the seed layer exposed from the plated mask pattern by performing electroplating by supplying power to the seed layer to fill the through hole with the electroplated layer;
removing the plated mask pattern; and
removing the seed layer exposed from the electroplated layer, and
the reinforcing via is formed of the seed layer and the electroplated layer.

* * * * *